United States Patent
Kamemoto et al.

(10) Patent No.: US 10,199,548 B2
(45) Date of Patent: Feb. 5, 2019

(54) PHOTOSENSITIVE RESIN COMPOSITION FOR THIN FILM TRANSISTORS, CURED FILM, THIN FILM TRANSISTOR, LIQUID CRYSTAL DISPLAY DEVICE OR ORGANIC ELECTROLUMINESCENT DISPLAY DEVICE, METHOD FOR PRODUCING CURED FILM, METHOD FOR MANUFACTURING THIN FILM TRANSISTOR, AND METHOD FOR MANUFACTURING LIQUID CRYSTAL DISPLAY DEVICE OR ORGANIC ELECTROLUMINESCENT DISPLAY DEVICE

(71) Applicant: TORAY INDUSTRIES, INC., Tokyo (JP)

(72) Inventors: Satoshi Kamemoto, Otsu (JP); Yusuke Komori, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/547,704

(22) PCT Filed: Mar. 16, 2016

(86) PCT No.: PCT/JP2016/058272
§ 371 (c)(1),
(2) Date: Jul. 31, 2017

(87) PCT Pub. No.: WO2016/158406
PCT Pub. Date: Oct. 6, 2016

(65) Prior Publication Data
US 2018/0017867 A1    Jan. 18, 2018

(30) Foreign Application Priority Data
Mar. 27, 2015  (JP) .................................. 2015-066009

(51) Int. Cl.
*H01L 33/56* (2010.01)
*H01L 27/12* (2006.01)
(Continued)

(52) U.S. Cl.
CPC ........ *H01L 33/56* (2013.01); *G02F 1/133345* (2013.01); *G03F 7/0048* (2013.01);
(Continued)

(58) Field of Classification Search
CPC ..................................................... H01L 33/56
(Continued)

(56) References Cited

U.S. PATENT DOCUMENTS 6,686,106 B2 * 2/2004 Yasuno ............... C08G 73/106
430/18
6,696,112 B2 * 2/2004 Okuda .............. G02F 1/133345
428/1.1
(Continued)

FOREIGN PATENT DOCUMENTS

JP        4525937 B2      8/2010
WO   WO 2005/121895 A1   12/2005
(Continued)

OTHER PUBLICATIONS

International Search Report, issued in PCT/JP2016/058272, PCT/ISA/210, dated May 31, 2016.
(Continued)

*Primary Examiner* — Calvin Lee
(74) *Attorney, Agent, or Firm* — Birch, Stewart, Kolasch & Birch, LLP

(57) ABSTRACT

The purpose of the present invention is to provide a photosensitive resin composition for thin film transistors, a cured film of which generates an extremely small amount of an outgas, and which is capable of forming an insulating layer for thin film transistors having excellent drive performance.

(Continued)

In order to achieve the above-described purpose, the present invention has the configuration described below. Namely, a photosensitive resin composition for thin film transistors, which contains (A) an alkali-soluble resin having an amide group and/or an imide group, (B) a photosensitive compound and (C) organic solvents, and wherein the content of an organic solvent having nitrogen atoms in the organic solvents (C) is 1% by mass or less relative to the total mass of the organic solvents.

15 Claims, 2 Drawing Sheets

(51) Int. Cl.
| | | |
|---|---|---|
| H01L 29/786 | (2006.01) | |
| H01L 51/05 | (2006.01) | |
| G02F 1/1333 | (2006.01) | |
| G03F 7/004 | (2006.01) | |
| G03F 7/022 | (2006.01) | |
| G03F 7/023 | (2006.01) | |
| G03F 7/075 | (2006.01) | |
| G03F 7/40 | (2006.01) | |
| H01L 23/58 | (2006.01) | |

(52) U.S. Cl.
CPC .......... *G03F 7/0226* (2013.01); *G03F 7/0233* (2013.01); *G03F 7/0755* (2013.01); *G03F 7/40* (2013.01); *H01L 27/1248* (2013.01); *H01L 29/786* (2013.01); *H01L 51/05* (2013.01); *G02F 1/133305* (2013.01)

(58) Field of Classification Search
USPC ................................. 257/642, 643; 438/780
See application file for complete search history.

(56) References Cited

U.S. PATENT DOCUMENTS

| | | | | |
|---|---|---|---|---|
| 6,929,890 | B2 * | 8/2005 | Miyoshi | G03F 7/0007 430/191 |
| 6,949,615 | B2 * | 9/2005 | Inoue | C07C 33/44 430/270.1 |
| 7,183,423 | B1 * | 2/2007 | Ishii | B01J 31/0247 549/313 |
| 7,790,297 | B2 * | 9/2010 | Nakagawa | H01L 27/3246 252/301.16 |
| 8,481,248 | B2 * | 7/2013 | Honda | B81C 99/008 430/320 |
| 8,741,988 | B2 * | 6/2014 | Klopsch | C08L 63/00 523/400 |
| 9,075,305 | B2 * | 7/2015 | Hsu | G03F 7/033 252/586 |
| 9,513,545 | B2 * | 12/2016 | Tanaka | C07D 313/10 |
| 9,777,196 | B2 * | 10/2017 | Thibault | C09J 125/14 |
| 9,897,915 | B2 * | 2/2018 | Komori | C09D 179/08 |
| 2013/0126860 | A1 | 5/2013 | Fukuda et al. | |
| 2015/0301453 | A1 | 10/2015 | Komori et al. | |
| 2018/0019290 | A1 * | 1/2018 | Arai | C08G 73/10 |

FOREIGN PATENT DOCUMENTS

| | | |
|---|---|---|
| WO | 2011-222788 A | 11/2011 |
| WO | WO 2014/097922 A1 | 6/2014 |
| WO | WO 2014/136922 A1 | 9/2014 |

OTHER PUBLICATIONS

Written Opinion of the International Searching Authority, issued in PCT/JP2016/058272, PCT/ISA/237, dated May 31, 2016.
Singaporean Written Opinion and Search Report, dated Aug. 17, 2018, for Singaporean Application No. 11201706425P.

* cited by examiner

[Fig 1]
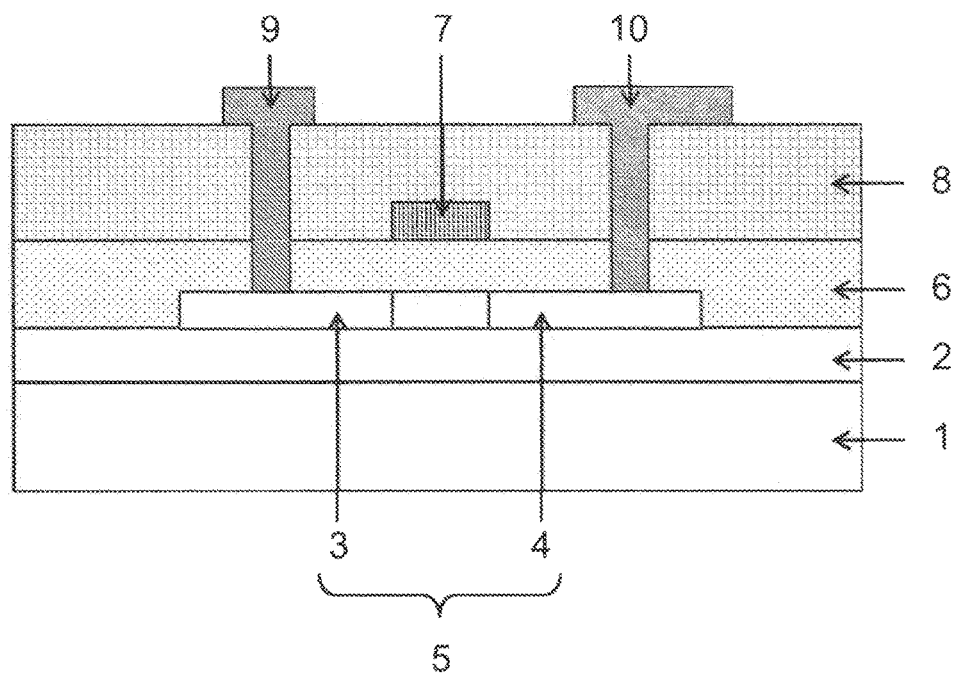

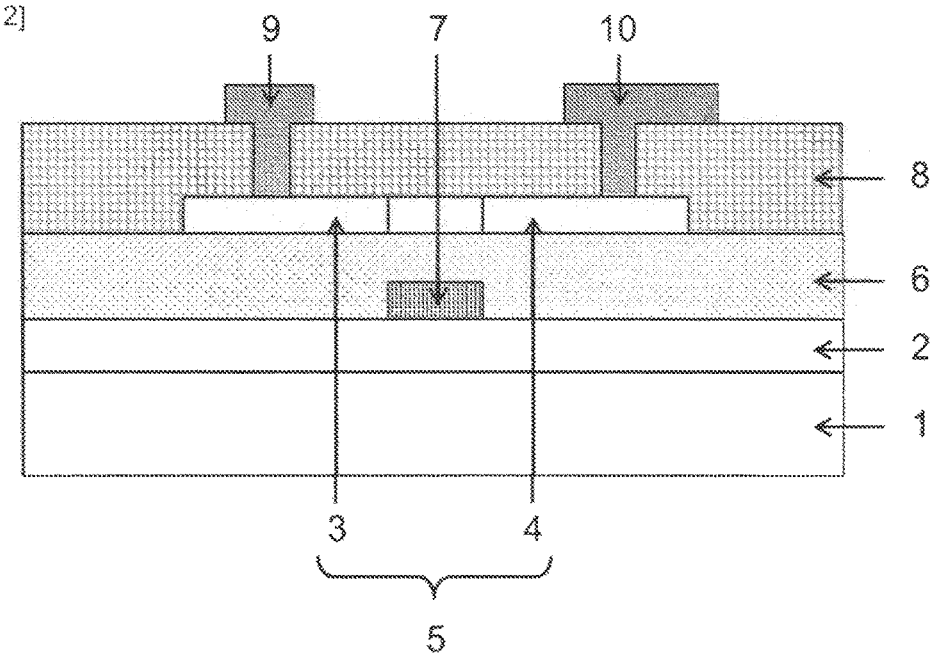
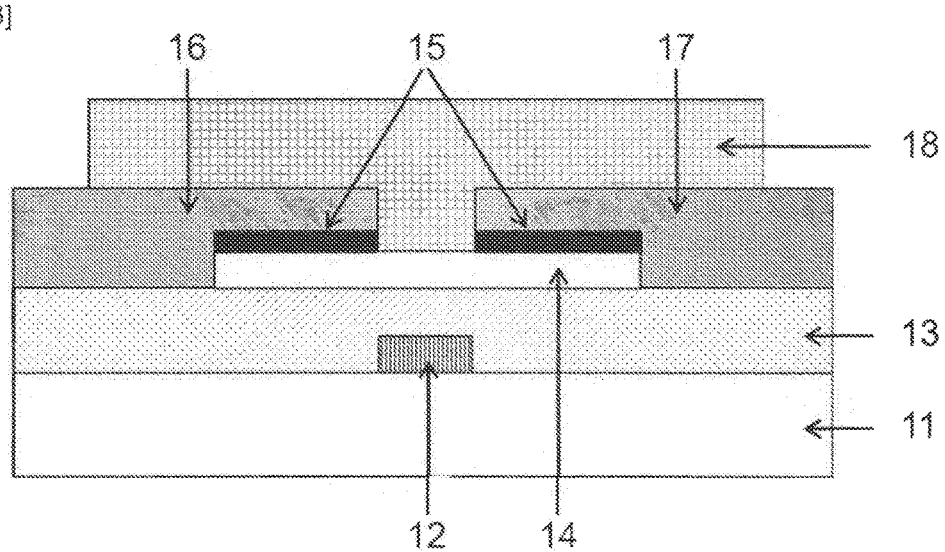

PHOTOSENSITIVE RESIN COMPOSITION FOR THIN FILM TRANSISTORS, CURED FILM, THIN FILM TRANSISTOR, LIQUID CRYSTAL DISPLAY DEVICE OR ORGANIC ELECTROLUMINESCENT DISPLAY DEVICE, METHOD FOR PRODUCING CURED FILM, METHOD FOR MANUFACTURING THIN FILM TRANSISTOR, AND METHOD FOR MANUFACTURING LIQUID CRYSTAL DISPLAY DEVICE OR ORGANIC ELECTROLUMINESCENT DISPLAY DEVICE

TECHNICAL FIELD

The present invention relates to a photosensitive resin composition for thin film transistors, a cured film, a thin film transistor, a liquid crystal display device or an organic electroluminescent display device, a method for producing a cured film, a method for manufacturing a thin film transistor, and a method for manufacturing a liquid crystal display device or an organic electroluminescent display device.

BACKGROUND ART

A mainstream of display devices such as liquid crystal display devices and organic EL display devices is those of an active matrix driving system in which the display devices are driven with a thin film transistor (hereinafter sometimes referred to as TFT) disposed in each pixel. Various insulating layers used in a TFT, such as a gate insulating layer and an interlayer insulating layer, are generally produced by forming a film of an inorganic material such as silicon nitride or silicon oxide by vapor deposition.

The vapor deposition method, however, has a problem that the vacuum equipment required for vapor deposition is very expensive. Furthermore, patterning of the deposited inorganic film requires complicated steps such as application, exposure, and development of a resist material, etching of an inorganic material, and removal of the resist material. Moreover, a flexible display device including a plastic substrate, which has been actively developed in recent years, has problems that cracks tend to occur in a conventional insulating layer made from an inorganic material and the durability of the insulating layer is insufficient.

In order to solve such problems, studies have been made about the use of a photosensitive resin composition as an organic material in a gate insulating layer and an interlayer insulating layer. An insulating layer made from a photosensitive resin composition can reduce the production cost because expensive vacuum deposition equipment is unnecessary. Further, patterning of the insulating layer can be performed by applying, exposing, and developing the photosensitive resin, so that it is possible to process the insulating layer easily without requiring a resist material. Furthermore, since the photosensitive resin layer has higher film toughness than an inorganic film does, crack generation can be suppressed when the layer is used in a flexible display device.

As a photosensitive resin composition for an insulating layer of a TFT, for example, materials containing a polyimide resin are proposed from the viewpoint of heat resistance (Patent Documents 1 and 2).

PRIOR ART DOCUMENTS

Patent Documents

Patent Document 1: Japanese Patent Laid-open Publication No. 64-24231

Patent Document 2: Japanese Patent Laid-open Publication No. 2011-222787

SUMMARY OF THE INVENTION

Problems to be Solved by the Invention

However these materials cannot be said to have sufficient performance from the viewpoint of suppression of outgassing, and have a problem that the driving performance is lowered due to outgassing components generated from the thermally cured insulating layer. In view of the above-mentioned problem, it is an object of the present invention to provide a photosensitive resin composition for thin film transistors with which it is possible to form an insulating layer for thin film transistors that is extremely little in outgassing from a cured film and that is excellent in driving performance.

Solutions to the Problems

The present invention provides a photosensitive resin composition for thin film transistors, containing (A) an amide group- and/or imide group-containing alkali-soluble resin, (B) a photosensitive compound, and (C) an organic solvent, wherein the organic solvent (C) contains 1% by mass or less of a nitrogen atom-containing organic solvent based on the organic solvent in total.

Effects of the Invention

The present invention can provide a photosensitive resin composition for thin film transistors with which it is possible to form an insulating layer for thin film transistors that is extremely little in outgassing from a cured film and that is excellent in driving performance.

BRIEF DESCRIPTION OF THE DRAWINGS

FIG. 1 is a cross-sectional view showing an example of a thin film transistor of the present invention.

FIG. 2 is a cross-sectional view showing another example of the thin film transistor of the present invention.

FIG. 3 is a cross-sectional view of a thin film transistor according to examples of the present invention.

EMBODIMENTS OF THE INVENTION

The resin composition for thin film transistors of the present invention is a photosensitive resin composition for thin film transistors containing (A) an amide group- and/or imide group-containing alkali-soluble resin, (B) a photosensitive compound, and (C) an organic solvent, wherein the organic solvent (C) contains 1% by mass or less of a nitrogen atom-containing organic solvent based on the organic solvent in total.

The photosensitive resin composition for thin film transistors of the present invention contains the amide group- and/or and/or imide group-containing alkali-soluble resin (A). As used herein, the term "alkali-soluble" means that the resin has a dissolution rate of 50 nm/min or more, the dissolution rate being obtained from a decrease in film thickness when a solution prepared by dissolving the resin in γ-butyrolactone is applied to a silicon wafer and pre-baked at 120° C. for 4 minutes to form a pre-baked film having a thickness of 10 μm±0.5 μm, the pre-baked film is immersed in a 2.38% by mass aqueous tetramethylammonium hydroxide solution at 23±1° C. for 1 minute, and then the pre-baked film is rinsed with pure water.

The amide group- and/or imide group-containing alkali-soluble resin (A) may be a polyimide, a polyimide precursor, a polybenzoxazole, a polybenzoxazole precursor, a polyaminoamide, or a polyamide, but is not limited thereto. The alkali-soluble resin may contain two or more of these resins. Among these alkali-soluble resins, those that are excellent in heat resistance and small in the amount of outgassing at high temperature are preferred. Specifically, at least one alkali-soluble resin selected from a polyimide, a polyimide precursor, and a polybenzoxazole precursor, or a copolymer thereof is preferred.

The alkali-soluble resin selected from a polyimide, a polyimide precursor, and a polybenzoxazole precursor, or a copolymer thereof, which can be used as the amide group- and/or imide group-containing alkali-soluble resin (A) of the present invention, preferably has an acidic group in the structural unit of the resin and/or the main chain end of the resin in order to have the alkali solubility. Examples of the acidic group include a carboxyl group, a phenolic hydroxyl group, a sulfonic acid group, and a thiol group. The alkali-soluble resin or a copolymer thereof preferably has a fluorine atom. The fluorine atom can impart water repellency to the interface between the resin film and the base material and suppress the infiltration of an alkaline aqueous solution into the interface when the resin film is developed with the alkaline aqueous solution. The fluorine atom content in the alkali-soluble resin or a copolymer thereof is preferably 5% by mass or more from the viewpoint of the effect of preventing the infiltration of the alkaline aqueous solution into the interface, and is preferably 20% by mass or less from the viewpoint of solubility in an alkaline aqueous solution.

The above-mentioned polyimide preferably has a structural unit represented by the following general formula (1), and the polyimide precursor and the polybenzoxazole precursor each preferably have a structural unit represented by the following general formula (2). The alkali-soluble resin may contain two or more of these, or a resin obtained by copolymerizing a structural unit represented by the general formula (1) with a structural unit represented by the general formula (2) may be used.

[Chemical Formula 1]

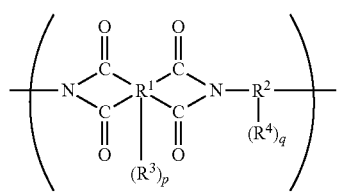

(1)

In the general formula (1), $R^1$ represents a tetravalent to decavalent organic group, and $R^2$ represents a divalent to octavalent organic group. $R^3$ and $R^4$ each represent a phenolic hydroxyl group, a carboxy group, a sulfonic acid group, or a thiol group, and each may be a single group or a combination of different groups, p and q each represent an integer of 0 to 6.

[Chemical Formula 2]

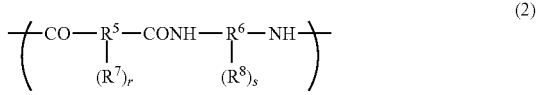

(2)

In the general formula (2), $R^5$ represents a divalent to octavalent organic group, and $R^6$ represents a divalent to octavalent organic group. $R^7$ and $R^8$ each represent a phenolic hydroxyl group, a sulfonic acid group, a thiol group, or $COOR^9$, and each may be a single group or a combination of different groups. $R^9$ represents a hydrogen atom, or a monovalent hydrocarbon group having 1 to 20 carbon atoms. r and s each represent an integer of 0 to 6, provided that r+s>0.

The alkali-soluble resin selected from a polyimide, a polyimide precursor, and a polybenzoxazole precursor, or a copolymer thereof preferably has 5 to 100,000 structural units represented by the general formula (1) and/or (2). In addition to the structural units represented by the general formula (1) and/or (2), the alkali-soluble resin or a copolymer thereof may have another structural unit. In this case, it is preferred that the structural units represented by the general formula (1) and/or (2) are contained in an amount of 50 mol % or more of the total number of structural units.

In the general formula (1), $R^1$—$(R^3)_p$ represents a residue of an acid dianhydride. $R^1$ is a tetravalent to decavalent organic group, and is particularly preferably an organic group having 5 to 40 carbon atoms and containing an aromatic ring or a cycloaliphatic group.

Specific examples of the acid dianhydride include pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)ether dianhydride, 1,2,5,6-naphthalenetetracarboxylic dianhydride, 9,9-bis(3,4-dicarboxyphenyl)fluorenic dianhydride, 9,9-bis{4-(3,4-dicarboxyphenoxy)phenyl}fluorenic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, aromatic tetracarboxylic dianhydrides such as an acid dianhydride having the structure shown below, and aliphatic tetracarboxylic dianhydrides such as butane tetracarboxylic dianhydride and 1,2,3,4-cyclopentanetetracarboxylic dianhydride. Two or more of these may be used.

[Chemical Formula 3]

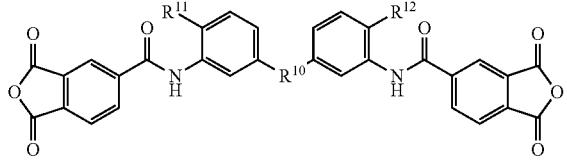

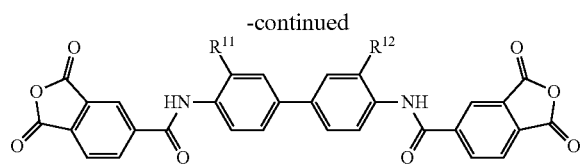

$R^{10}$ represents an oxygen atom, $C(CF_3)_2$, or $C(CH_3)_2$. $R^{11}$ and $R^{12}$ each represent a hydrogen atom or a hydroxyl group.

In the general formula (2), $R^5$—$(R^7)_r$ represents a residue of an acid. $R^5$ is a divalent to octavalent organic group, and is particularly preferably an organic group having 5 to 40 carbon atoms and containing an aromatic ring or a cycloaliphatic group.

Examples of the acid component include dicarboxylic acids such as terephthalic acid, isophthalic acid, diphenyl ether dicarboxylic acid, bis(carboxyphenyl)hexafluoropropane, biphenyldicarboxylic acid, benzophenone dicarboxylic acid, and triphenyldicarboxylic acid, tricarboxylic acids such as trimellitic acid, trimesic acid, diphenyl ether tricarboxylic acid, and biphenyltricarboxylic acid, and tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, 3,4,9,10-perylenetetracarboxylic acid, aromatic tetracarboxylic acids having the structure shown below, and aliphatic tetracarboxylic acids such as butane tetracarboxylic acid and 1,2,3,4-cyclopentanetetracarboxylic acid. Two or more of these may be used.

[Chemical Formula 4]

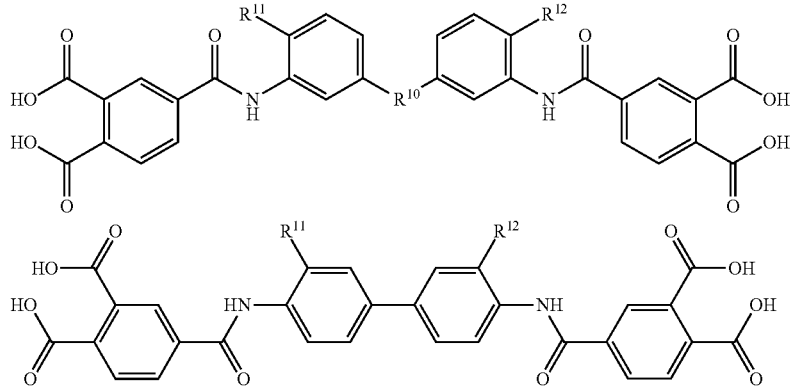

$R^{10}$ represents an oxygen atom, $C(CF_3)_2$, or $C(CH_3)_2$. $R^{11}$ and $R^{12}$ each represent a hydrogen atom or a hydroxyl group.

Among them, in the tricarboxylic acids and the tetracarboxylic acids, one or two carboxyl groups correspond to the $R^7$ group in the general formula (2). Further, it is more preferred that 1 to 4 hydrogen atoms of the dicarboxylic acids, tricarboxylic acids, or tetracarboxylic acids mentioned above are substituted with the $R^7$ group in the general formula (2), preferably a phenolic hydroxyl group. These acids can be used as they are, or as acid anhydrides or active esters.

$R^2$—$(R^4)_q$ in the general formula (1) and $R^6$—$(R^8)_s$ in the general formula (2) each represent a residue of a diamine. $R^2$ and $R^8$ are each a divalent to octavalent organic group, and are particularly preferably each an organic group having 5 to 40 carbon atoms and containing an aromatic ring or a cycloaliphatic group.

Specific examples of the diamine include 3,4'-diaminodiphenyl ether, 4,4'-diaminodiphenyl ether, 3,4'-diaminodiphenylmethane, 4,4'-diaminodiphenylmethane, 1,4-bis(4-aminophenoxy)benzene, benzidine, m-phenylenediamine, p-phenylenediamine, 1,5-naphthalenediamine, 2,6-naphthalenediamine, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, compounds obtained by substituting at least part of hydrogen atoms of aromatic rings of these compounds with alkyl groups or halogen atoms, aliphatic cyclohexyldiamine, methylenebis cyclohexylamine, and diamines having the structure shown below. Two or more of these may be used.

[Chemical Formula 5]

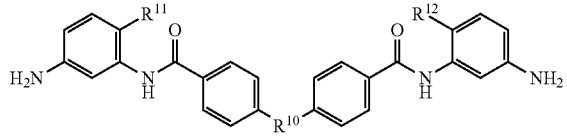

-continued

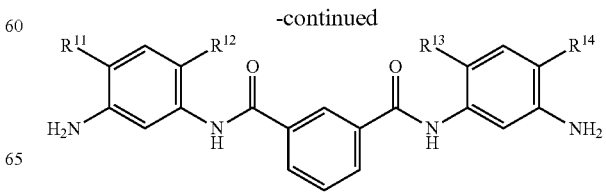

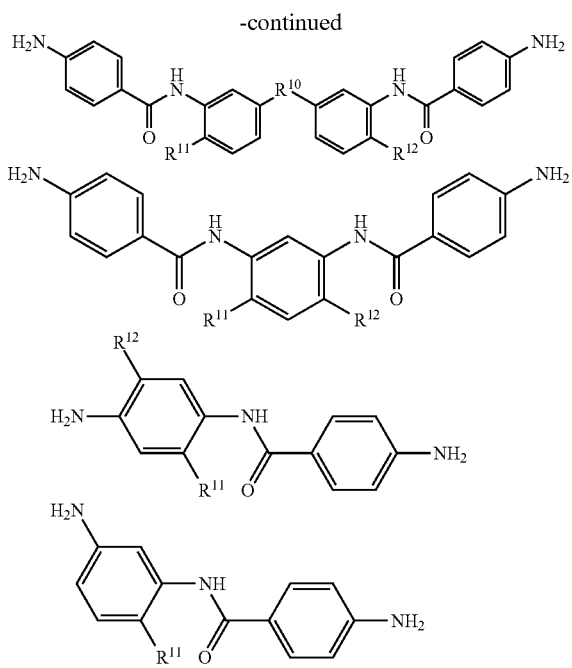

$R^{10}$ represents an oxygen atom, $C(CF_3)_2$, or $C(CH_3)_2$. $R^{11}$ to $R^{14}$ each independently represent a hydrogen atom or a hydroxyl group.

These diamines can be used as diamines, or as corresponding diisocyanate compounds or trimethylsilylated diamines.

Moreover, resins having an acidic group at the main chain end can be obtained by capping the end of the above-mentioned resins with a monoamine having an acidic group, an acid anhydride, a monocarboxylic acid monoacid chloride, or a mono-active ester.

Preferred examples of the monoamine having an acidic group include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicyclic acid, 5-aminosalicyclic acid, 6-aminosalicyclic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these may be used.

Preferred examples of the acid anhydride, acid chloride, and monocarboxylic acid include acid anhydrides such as phthalic anhydride, maleic anhydride, nadic anhydride, cyclohexanedicarboxylic anhydride, and 3-hydroxyphthalic anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynapthalene, 1-mercapto-6-carboxynaphthalene, and 1-mercapto-5-carboxynaphthalene, monoacid chlorides in which a carboxyl group of these compounds is converted to an acid chloride, monoacid chlorides in which only one carboxyl group of dicarboxylic acids, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene is converted to an acid chloride, and mono-active esters obtained by reaction of a monoacid chloride with N-hydroxybenzotriazole or N-hydroxy-5-norbornene-2,3-dicarboximide. Two or more of these may be used.

The content of the end-capping agent such as the monoamine, acid anhydride, monocarboxylic acid, monoacid chloride, and mono-active ester is preferably 2 to 25 mol % based on 100 mol % in total of the acid component and the amine component constituting the resin.

The end-capping agent introduced into the resin can be easily detected by the following method. The end-capping agent can be easily detected by dissolving a resin containing the end-capping agent introduced therein in an acidic solution to decompose the resin into an amine component and an acid component which are constituent units of the resin, and analyzing the components by gas chromatography (GC) or NSMR, for example. Alternatively, it is also possible to detect the end-capping agent by directly analyzing the resin containing the end-capping agent introduced therein through pyrolysis gas chromatograph (PGC), infrared spectrum, and $^{13}$C-NMR spectrum.

The amide group- and/or imide group-containing alkali-soluble resin (A) used in the present invention can be synthesized by a known method.

In the case of a polyamic acid or a polyamic acid ester, for example, the amide group- and/or imide group-containing alkali-soluble resin can be synthesized by a method of reacting a tetracarboxylic dianhydride with a diamine compound at low temperature, a method of obtaining a diester from a tetracarboxylic dianhydride and an alcohol, and then reacting the diester in the presence of an amine and a condensing agent, or a method of obtaining a diester from a tetracarboxylic dianhydride and an alcohol, then converting the remaining dicarboxylic acid to an acid chloride, and reacting the acid chloride with an amine.

In the case of the polybenzoxazole precursor, for example, it can be obtained by condensing a bisaminophenol compound with a dicarboxylic acid. Specifically, there is a method of reacting a dehydrating condensing agent such as dicyclohexylcarbodiiraide (DCC) with an acid, and adding a bisaminophenol compound to the resultant mixture, and a method of dropwise adding a solution of a dicarboxylic acid dichloride to a solution of a bisaminophenol compound containing a tertiary amine such as pyridine.

In the case of the polyimide, for example, it can be obtained by dehydration ring closure of a polyamic acid or a polyamic acid ester, which is obtained by the above-mentioned method, through heating or chemical treatment with an acid or a base.

The photosensitive resin composition for thin film transistors of the present invention contains the photosensitive compound (B). The photosensitive compound is a compound whose chemical structure changes when the compound senses ultraviolet rays. Specific examples of the photosensitive compound include photoacid generators, photobase generators, and photoradical generators. Among them, a photoacid generator generates an acid in a light irradiated part and increases the solubility of the light irradiated part in an alkaline aqueous solution, so that it can give a positive pattern in which the light irradiated part is soluble. A photobase generator generates a base in a light irradiated part and decreases the solubility of the light irradiated part in an alkaline aqueous solution, so that it can give a negative pattern in which the light irradiated part is insolubilized. A photoradical generator generates a radical in a light irradiated part and decreases the solubility of the light irradiated part in an alkaline aqueous solution when used in combination with a radical reactive compound such as an ethylenic double bond, so that it can give a negative pattern in which the light irradiated part is insolubilized.

Among the examples of the photosensitive compound (B), a photoacid generator is preferred from the viewpoint that it is easy to give a pattern with high sensitivity and high resolution. Examples of the photoacid generator include quinonediazide compounds, sulfonium salts, phosphonium salts, diazonium salts, and iodonium salts. The photosensitive compound (B) is more preferably a quinonediazide compound among photoacid generators, since the compound easily gives a pattern with high sensitivity and high resolution without undergoing heat treatment after exposure.

In preferred quinonediazide compound is a compound in which a sulfonic acid of naphthoquinonediazidesulfonic acid is ester-bonded to a phenolic hydroxyl group-containing compound. Examples of the phenolic hydroxyl group-containing compound used in the present invention include Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, PML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (trade names, all available from Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (trade names, all available from ASAHI YUKIZAI CORPORATION), and 2,6-dimethoxymethyl-4-tert-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylene bisphenol, and BisP-AP (trade names, all available from Honshu Chemical Industry Co., Ltd.). Preferred examples of the quinonediazide compound used in the present invention include those obtained by introducing 4-naphthoquinonediazidesulfonic acid or 5-naphthoquinonediazidesulfonic acid into the phenolic hydroxyl group-containing compound by an ester bond, but compounds other than these can also be used.

The 4-naphthoquinone diazide sulfonyl ester compound has absorption in the i-line region of a mercury lamp, and is suitable for i-line exposure. Absorption of the 5-naphthoquinone diazide sulfonyl ester compound is extended to the g-line region of a mercury lamp, and the compound is suitable for g-line exposure. In the present invention, both the 4-naphthoquinone diazide sulfonyl ester compound and 5-naphthoquinone diazide sulfonyl ester compound can be preferably used, and it is preferred to select either the 4-naphthoquinone diazide sulfonyl ester compound or 5-naphthoquinone diazide sulfonyl ester compound depending on the wavelength during exposure. Further, a naphthoquinone diazide sulfonyl ester compound containing both a 4-naphthoquinonediazidesulfonyl group and a 5-naphthoquinonediazidesulfonyl group in one molecule can be obtained, or a mixture of a 4-naphthoquinone diazide sulfonyl ester compound and a 5-naphthoquinone diazide sulfonyl ester compound can be used.

More preferably, the quinonediazide compound contains a 4-naphthoquinone diazide sulfonyl ester compound. The quinone diazide structure and the sulfonyl ester structure of the 4-naphthoquinone diazide sulfonyl ester compound are more easily thermally decomposed than those structures of the 5-naphthoquinone diazide sulfonyl ester compound. Therefore, incorporation of the 4-naphthoquinone diazide sulfonyl ester compound makes it easier for components low in heat resistance to be removed outside the film in the thermal curing step to reduce the components originated from outgassing remaining in the cured film. As a result, it becomes easier to provide a thin film transistor that is extremely small in the amount of outgassing from the insulating layer and is excellent in driving performance. The content of the 4-naphthoquinone diazide sulfonyl ester compound in the total content of the photosensitive compound (B) is preferably 50% by mass or more, more preferably 70% by mass, further preferably 100% by mass.

The naphthoquinone diazide sulfonyl ester compound can be synthesized by an esterification reaction of a phenolic hydroxyl group-containing compound and a naphthoquinonediazidesulfonic acid compound, and can be synthesized by a known method. Use of such naphthoquinone diazide sulfonyl ester compound further improves the resolution, sensitivity, and residual film ratio.

The content of the photosensitive compound (B) used in the present invention is preferably 0.1 parts by mass or more, more preferably 1 part by mass or more, further preferably 2 parts by mass or more, and is preferably 20 parts by mass or less, more preferably 14 parts by mass or less, further preferably 10 parts by mass or less based on 100 parts by mass of the amide group- and/or imide group-containing alkali-soluble resin (A). When the content is 0.1 parts by mass or more, pattern formation is facilitated, whereas when the content is 20 parts by mass or less, the amount of outgassing from the photosensitive compound can be easily suppressed.

The photosensitive resin composition for thin film transistors of the present invention contains the organic solvent (C). The organic solvent may be used singly, or it may be a mixed solvent of two or more solvents. It is essential that the content of the nitrogen atom-containing organic solvent is 1% by mass or less based on the organic solvent in total.

As a result of intensive studies, the inventors have found the following matter: a nitrogen atom-containing organic solvent has very high affinity with an amide group and/or an imide group contained in a resin skeleton of the amide group- and/or imide group-containing alkali-soluble resin (A), and thus the organic solvent is hardly removed in the thermal curing step even when contained in a small amount and remains in the cured insulating layer, so that the driving performance of the thin film transistor especially at high temperature is lowered.

Examples of the nitrogen atom-containing organic solvent include those having a functional group such as an amide group, a urethane group, and a urea group. Specific examples thereof include 2-pyrrolidone, methyl-2-pyrrolidone, N-ethyl-2-pyrrolidone, N-propyl-2-pyrrolidone, N-butyl-2-pyrrolidone, N-cyclohexyl-2-pyrrolidone, N-(2-hydroxyethyl)-2-pyrrolidone, N-phenyl-2-pyrrolidone, N-vinyl-2-pyrrolidone, N,N'-dimethylpropyleneurea, 1,3-dimethyl-2-imidazolidinone, 2-piperidone, ε-caprolactam, N,N-dimethylformamide, N,N-diethylformamide, N,N-dimethylacetamide, N,N-diethylacetamide, N,N-dimethylmethoxyacetamide, N,N-dimethylisobutyramide, N,N-dimethylmethoxyethylamide, 3-methoxy-N,N-dimethylpropionamide, 3-butoxy-N,N-dimethylpropionamide, acetamide, benzamide, naphthamide, isophthalamide, terephthalamide, nicotinamide, isonicotinamide, formamide, propionamide, butyramide, isobutyramide, oxamide, benzylamide, triacetamide, dibenzamide, tribenzamide, urea, butylurea, dibutylurea, 1,3-dimethylurea, 1,3-diethylurea, glutaramide, butanediamide, hexanediamide, 1,3-dimethyl-2-imidazolidinone, ethyl N-methylcarbamate, urea, butylurea, dibutylurea, 1,3-dimethylurea, 1,3-diethylurea, N,N'-dimethylpropyleneurea, methoxy-N,N-dimethylpropion, butoxy-N,N-dimethylpropion, and derivatives thereof. These nitrogen atom-containing organic solvents all have high polarity and well dissolve the amide group- and/or imide group-containing alkali-soluble resin (A), and thus are suitably used as organic solvents for such resin. However, the inventors found that, in the application to the insulating layer of the thin film transistor of the present invention, the nitrogen atom-containing organic solvent remains in the cured insulating layer even when thermally cured at a temperature higher than the boiling point of the solvent. The inventors also found that this trace amount of residual solvent lowers the driving performance of the thin film transistor. Therefore, in the present invention, it is essential that the content of the nitrogen atom-containing organic solvent is 1% by mass or less based on the organic solvent in total.

The content of the nitrogen atom-containing organic solvent in the organic solvent (C) is preferably 0.01% by mass or more, more preferably 0.05% by mass or more, essentially 1% by mass or less, and is preferably 0.5% by mass or less, more preferably 0.3% by mass or less based on the organic solvent in total. Setting the content to 0.01% by mass or more makes it possible to suppress the deposition of foreign matters to reduce the occurrence of defective characteristics of the insulating film caused by the foreign matters even when the photosensitive resin composition for thin film transistors is stored at low temperature of −10° C. or lower for a long period of time. As used herein, the term "foreign matters" refers to organic fine particles produced by agglomeration and insolubilization of part of the photosensitive resin composition components dissolved in an organic solvent, in particular, the amide group- and/or imide group-containing alkali-soluble resin (A). The nitrogen atom-containing organic solvent has very high affinity with the amide group and/or imide group contained in the resin skeleton of the amide group- and/or imide group-containing alkali-soluble resin (A). It is considered that incorporation of a nitrogen atom-containing organic solvent in a very small amount at which the driving performance of the thin film transistor is not lowered suppresses agglomeration of resin components even when the photosensitive resin composition for thin film transistors is stored at low temperature for a long period of time.

Among the nitrogen atom-containing organic solvents, examples of solvents that are particularly excellent in the effect of suppressing the deposition of foreign matters include N-methyl-2-pyrrolidone, N-ethyl-2-pyrrolidone, N,N-dimethylformamide, N,N-diethylformamide, N,N-dimethylacetamide, N,N-diethylacetamide, 1,3-dimethyl-2-imidazolidinone, and N,N-dimethylisobutyramide.

Further, it is preferred that the content of the organic solvent satisfying the following (1) and (2) in the organic solvent (C) is 80% by mass or more based on the organic solvent in total:

(1) a solubility parameter of 8.0 or more and 11.0 or less [unit: $(cal/cm^3)^{1/2}$]; and (2) an organic compound composed of a carbon atom, a hydrogen atom, and an oxygen atom.

First, an organic solvent having (1) a solubility parameter of 8.0 or more and 11.0 or less, which is the first requirement for the organic solvent, will be described. Herein, the solubility parameter is used as an index of compatibility and affinity among a plurality of substances, and is defined by the expression represented by the following (Formula 1).

$$\delta = (\Delta E_V/V_0)^{1/2}/2.046 \; [(cal/cm^3)^{1/2}] \quad \text{(Formula 1)}$$

In Formula 1, $\Delta E_V$ [$10^6$ N·m·mol$^{-1}$] is the heat of evaporation, and $V_0$ [m$^3$·mol$^{-1}$] is the volume per mole. Values of the solubility parameter are smaller for those with lower polarity and larger for those with higher polarity. For example, solubility parameters of n-hexane, ethanol, and water are 7.3, 12.7, and 23.4, respectively. A difference in solubility parameter between two substances is closely related to the energy required for the two substances to be compatible with each other. As the difference in solubility parameter is smaller, the energy required for the two substances to be compatible with each other is smaller. That is, when there are two substances, in general, the smaller the difference in solubility parameter is the higher the affinity and compatibility are between the two substances.

The solubility parameter can be determined experimentally, and can also be determined by calculation. A method of determining the solubility parameter by calculation may be, for example, a method proposed by Fedors et al. (POLYMER ENGINEERING AMD SCIENCE, FEBRUARY, 1974, Vol. 14, No. 2, ROBERT F. FEDORS.). In addition, data on solubility parameters of various organic solvents are described in "POLYMER HANDBOOK FOURTH EDITION" (WILEY-INTERSCIENCE).

In the present invention, a preferred range of the solubility parameter is 8.0 or more, more preferably 8.4 or more, and is 11.0 or less, more preferably 10.6 or less. Setting the solubility parameter to 8.0 or more makes it possible to sufficiently dissolve the amide group- and/or imide group-containing alkali-soluble resin (A). Selecting an organic solvent which has a solubility parameter of 11.0 or less and satisfies the second requirement makes it possible to easily remove the organic solvent in the step of thermally curing the photosensitive resin and sufficiently reduce the organic solvent remaining in the cured insulating layer, so that excellent driving performance can be easily exerted. The reason therefor will be further described below.

In general, when there are two substances, the smaller the difference in solubility parameter is, the higher the affinity and compatibility are between the two substances. Therefore, it is preferred to select an organic solvent having a solubility parameter close to that of the resin. The amide group- and/or imide group-containing alkali-soluble resin (A) used in the present invention is a highly polar resin because it has an amide group and/or an imide group, and many polar groups for imparting alkali solubility, such as a carboxyl group, a phenolic hydroxyl group, a sulfonic acid group, and a thiol group in its skeleton, and thus has high solubility parameter. In the case of a polyimide, a polyimide precursor, or a polybenzoxazole precursor which can be used as an alkali-soluble resin, the solubility parameter is generally in the range of 12.0 to 16.0. A highly polar solvent having high affinity with the resin, that is, a highly polar solvent having a solubility parameter close to that of the resin is excellent in terms of solubility, but it is difficult to remove the organic solvent in the step of thermally curing the photosensitive resin due to the high affinity.

In contrast, the organic solvent preferably used in the present invention has a solubility parameter of 11.0 or less, and an organic solvent having a solubility parameter separate from that of the resin is selected. This means that the affinity between the organic solvent and the resin is relatively low. Since the affinity is low, the organic solvent is easily removed in the step of thermally curing the photosensitive resin, and the organic solvent remaining in the cured insulating layer can be sufficiently reduced. This makes it easier to give a thin film transistor with less outgassing from the insulating layer and excellent in driving performance.

Next, the second requirement for the organic solvent, that is, the organic solvent is (2) an organic compound composed of a carbon atom, a hydrogen atom, and an oxygen atom will be described. The organic solvent can moderately improve the solubility of the amide group- and/or imide group-containing alkali-soluble resin (A) used in the present invention because of a solvation capability originating from a lone pair of the oxygen atom in the molecular structure of the solvent. On the other hand, in an organic solvent, having a nitrogen atom in the molecular structure, examples of which include those having a functional group such as an amide group, a urethane group, and a urea group, the organic solvent is hardly removed in the step of thermally curing the resin because the functional group is very high in affinity with an amide group or an imide group contained in the resin skeleton, and the organic solvent remains in the cured insulating layer, so that the driving performance of the thin film transistor is adversely affected. Therefore, it is preferred that the organic solvent is an organic compound composed of a carbon atom, a hydrogen atom, and an oxygen atom. Examples of such a chemical structure include an ether group, an alcohol group, an ester group, and a ketone group.

Examples of the organic solvent satisfying (1) and (2) include ethylene glycol mono-n-butyl ether (9.5, 171° C.), diethylene glycol monomethyl ether (10.7, 194° C.), diethylene glycol monoethyl ether (10.4, 202° C.), diethylene glycol mono-n-butyl ether (9.5, 230° C.), diethylene glycol dimethyl ether (8.8, 162° C.), diethylene glycol ethyl methyl ether (8.7, 176° C.), diethylene glycol diethyl ether (8.6, 189° C.), propylene glycol monomethyl ether (10.1, 120° C.), dipropylene glycol monomethyl ether (9.3, 188° C.), dipropylene glycol dimethyl ether (8.2, 171° C.), cyclohexanone (9.9, 156° C.), cyclopentanone (10.4, 130° C.), 2-hexanone (8.9, 128° C.), diacetone alcohol (9.2, 166° C.), propylene glycol monomethyl acetate (8.7, 146° C.), ethyl lactate (10.0, 155° C.), butyl lactate (9.4, 185° C.), n-butyl acetate (8.5, 126° C.), 3-methoxybutyl acetate (8.7, 173° C.), 3-methyl-3-methylbutyl acetate (9.3, 188° C.), and ethyl ethoxypropionate (8.9, 166° C.). The numerical values in the parentheses after the names of the organic solvents indicate the solubility parameter [unit: $(cal/cm^3)^{1/2}$] and the boiling point at atmospheric pressure in order.

The content of the organic solvent satisfying (1) and (2) in the organic solvent (C) is preferably 80% by mass or more, more preferably 90% by mass or more, further preferably 99% by mass or more based on the organic solvent in total. When the content is 80% by mass or more, the organic solvent remaining in the cured insulating layer can be sufficiently reduced.

As the organic solvent (C) used in the present invention, an organic solvent, other than the organic solvent satisfying (1) and (2) can be used together according to the purpose.

In the photosensitive resin composition for thin film transistors of the present invention, the organic solvent (C) satisfying (1) and (2) preferably further satisfies the following (3):

(3) a boiling point at atmospheric pressure of 100° C. or higher and 180° C. or lower.

Selecting an organic solvent, having a boiling point at atmospheric pressure of 100° C. or higher makes it possible to prevent poor coating due to too high solvent volatility, and selecting an organic solvent having a boiling point at atmospheric pressure of 180° C. or lower makes it possible to further reduce the organic solvent remaining in the cured insulating layer.

The content of the organic solvent (C) used in the present invention is preferably 100 to 2,000 parts by mass based on 100 parts by mass of the amide group- and/or imide group-containing alkali-soluble resin (A).

Incidentally, the organic solvent (C) used in the present invention includes not only organic solvents intentionally added for dissolving the resin composition but also organic solvents contained as impurities in the photosensitive resin composition for thin film transistors.

The photosensitive resin composition for thin film transistors of the present Invention can contain a thermal crosslinking agent. The term "thermal crosslinking agent" refers to a compound having at least two thermally reactive functional groups, such as an alkoxymethyl group, a methylol group, an epoxy group, and an oxetanyl group in the molecule. The thermal crosslinking agent can crosslink the amide group- and/or imide group-containing alkali-soluble resin (A) or other additive components to improve the heat resistance, chemical resistance, and hardness of the thermally cured film.

Preferred examples of the compound having at least two alkoxymethyl groups or methylol groups include DML-PC, DML-PEP, DML-OC, DML-OEP, DML-34X, DML-PTBP, DML-PCHP, DML-OCHP, DML-PFP, DML-PSBP, DHL-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TMP-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (trade names, all manufactured, by Honshu Chemical Industry Co., Ltd.), and NIKALAC (registered trademark) MX-290, NIKALAC MX-280, NIKALAC MX-270, NIKALAC MX-279, NIKALAC MW-100 LM, and NIKALAC MX-750 LM (trade names, all manufactured by SANWA Chemical Co., Ltd.), which are available from the respective companies mentioned above.

Preferred examples of the compound having at least two epoxy groups include Epolight 40E, Epolight 100E, Epolight 200E, Epolight 400E, Epolight 70P, Epolight 200P, Epolight 400P, Epolight 1500NP, Epolight 80MF, Epolight 4000, and Epolight 3002 (all manufactured by Kyoeisha Chemical Co., Ltd.), Denacol (registered trademark) EX-212L, Denacol EX-214L, Denacol EX-216L, Denacol EX-321L, and Denacol EX-850L (all manufactured by Nagase ChemteX Corporation), Epikote 828, Epikote 1002, Epikote 1750, Epikote 1007, YX8100-BH30, E1256, E4250, and E4275 (all manufactured by Japan Epoxy Resin Co., Ltd.), EPICLON (registered trademark) EXA-9583, HP4032, HP7300, and N695 (all manufactured by DIC Corporation), VG 3101 (manufactured by Mitsui Chemicals, Inc.), TEPIC (registered trademark) S, TEPIC G, and TEPIC P (all manufactured by Nissan Chemical Industries, Ltd.), EPOTOHTO (registered trademark) YH-434L (manufactured by NIPPON STEEL & SUMIKIN CHEMICAL CO., LTD.), and EPPN 502 H, NC 3000, NC 6000, GAN, and GOT (all manufactured by Nippon Kayaku Co., Ltd.), which are available from the respective companies mentioned above.

Preferred examples of the compound having at least two oxetanyl groups include ETERNACOLL (registered trademark) EHO, ETERNACOLL OXBP, ETERNACOLL OXTP, and ETERNACOLL OXMA (all manufactured by Ube Industries, Ltd.), and oxetanized phenol novolac.

Two or more kinds of thermal crosslinking agents may be used in combination.

The content of the thermal crosslinking agent is preferably 0.1 parts by mass or more and 30 parts by mass or less based on 100 parts by mass of the amide group- and/or imide group-containing alkali-soluble resin (A). When the content of the thermal crosslinking agent is 0.1 parts by mass or more and 30 parts by mass or less, the chemical resistance and hardness of the film after firing or after curing can be improved easily, and the storage stability of the photosensitive resin composition for thin film transistors can also be improved easily.

The photosensitive resin composition for thin film transistors of the present invention preferably further contains (D) an adhesion improver. Examples of the adhesion improver (D) include silane coupling agents such as vinyltrimethoxysilane, vinyltriethoxysilane, epoxycyclohexylethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane, and N-phenyl-3-aminopropyltrimethoxysilane, a titanium chelating agent, an aluminum chelating agent, and a compound obtained by reacting an aromatic amine compound with an alkoxy group-containing silicon compound. The photosensitive resin composition for thin film transistors may contain two or more of these. Incorporation of the adhesion improver (D) makes it possible to enhance the adhesion to an underlying base material such as a silicon wafer, ITO, $SiO_2$, and silicon nitride at the time of development of the photosensitive resin film. In addition, resistance to oxygen plasma and UV ozone treatment used for cleaning and the like can be enhanced. Further, the driving performance of the thin film transistor can be further improved. Although the mechanism is not clear, it is presumed that the driving performance of the thin film transistor is further improved by the incorporation of an adhesion improver since the adhesion improver increases the adhesion to the underlying base material and makes it difficult for the resin composition to peel off the underlying base material even under severe conditions such as high temperature and high humidity.

The adhesion improver (D) preferably contains a nitrogen atom-containing silane coupling agent. This is because the nitrogen atom-containing silane coupling agent has high affinity with the amide group- and/or imide group-containing alkali-soluble resin (A), and has a particularly high adhesion improving effect. Examples of the nitrogen atom-containing silane coupling agent include 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane, 3-ureidopropyltriethoxysilane, 3-(2-aminoethyl)aminopropyltrimethoxysilane, and 3-(2-aminoethyl)aminopropylmethyldimethoxysilane.

The content of the adhesion improver (D) is preferably 0.1 parts by mass or more and 10 parts by mass or less based on 100 parts by mass of the amide group- and/or imide group-containing alkali-soluble resin (A).

The photosensitive resin composition for thin film transistors of the present invention may optionally contain a surfactant for the purpose of improving the wettability with the substrate and improving the thickness uniformity of the coating film. The surfactant can be a commercially available compound. Specific examples of the surfactant include silicone surfactants such as SH series, SD series, and ST series manufactured by Dow Corning Toray Silicone Company, Ltd., BYK series manufactured by BYK Japan KK, KP series manufactured by Shin-Etsu Silicone, DISFOAM series manufactured by NOF Corporation, and TSF series manufactured by Toshiba Silicone Co., Ltd., fluorine-containing surfactants such as "Megafac (registered trademark)" series manufactured by Dainippon Ink & Chemicals, Inc., FLUORAD series manufacture by Sumitomo 3M Limited, "SURFLON (registered trademark)" series and "AsahiGuard (registered trademark)" series manufactured by Asahi Glass Co., Ltd., EF series manufactured by Shin-Akita Kasei K.K., and PolyFox series manufactured by OMNOVA Solutions, and surfactants made from an acrylic and/or methacrylic polymer such as POLYFLOW series manufactured by KYOEISHA CHEMICAL Co., LTD., and "DISPARLON (registered trademark)" series manufactured by Kusumoto Chemicals, Ltd., which are available from the respective companies mentioned above, but are not particularly limited thereto.

The content of the surfactant is preferably 0.001 parts by mass or more and 1 part by mass or less based on 100 parts by mass of the amide group- and/or imide group-containing alkali-soluble resin (A). Setting the content in the above-mentioned range makes it possible to improve the wettability with the substrate and the thickness uniformity of the coating film without causing defects such as air bubbles and pinholes.

The photosensitive resin composition for thin film transistors of the present invention may optionally contain a phenolic hydroxyl group-containing compound for the purpose of supplementing the alkali developability of the photosensitive resin composition for thin film transistors. Examples of the phenolic hydroxyl group-containing compound include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCRIPZ, BisOCP-IPZ, BisOIPP-CP, Bis26X-IPZ, BisOTBP-CP, TekP-4HBPA (tetrakis P-DO-BPA), TrisPHAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, and BisRS-OCHP (trade names, all available from Honshu Chemical Industry Co., Ltd.), BIR-OC, BIP-PCBIR-PC, BIR-PTBP, BIR-PCHP, BIP-BIOC-F, 4PC, BIR-BIPC-F, and TEP-BIP-A (trade names, all available from ASAHI YUKIZAI CORPORATION), 1,4-dihydroxynaphthalene, 1,5-dihydroxynaphthalene, 1,6-dihydroxynaphthalene, 1,7-dihydroxynaphthalene, 2,3-dihydroxynaphthalene, 2,6-dihydroxynaphthalene, 2,7-dihydroxynaphthalene, 2,4-dihydroxyquinoline, 2,6-dihydroxyquinoline, 2,3-dihydroxyquinoxaline, anthracene-1,2,10-triol, anthracene-1,8,9-triol, and 8-quinolinol. Incorporation of these phenolic hydroxyl group-containing compounds makes the resultant photosensitive resin composition for thin film transistors hardly soluble in an alkali developer before exposure and easily soluble in an alkali developer after exposure. Thus, film reduction due to development is small, and the photosensitive resin composition is easily developed in a short time. Therefore, the sensitivity is easily improved.

The content of the phenolic hydroxyl group-containing compound is preferably 1 part by mass or more and 20 parts by mass or less based, on 100 parts by mass of the amide group- and/or imide group-containing alkali-soluble resin (A). When the content is within the above-mentioned range, it is possible to enhance the alkali developability of the photosensitive resin composition for thin film transistors while maintaining high heat resistance.

The photosensitive resin composition for thin film transistors of the present invention may contain inorganic particles for the purpose of improving the relative permittivity and hardness of the cured film, and reducing the coefficient of linear thermal expansion thereof. Preferred specific examples of the inorganic particles include silicon oxide, titanium oxide, barium titanate, barium sulfate, barium oxide, zirconium oxide, hafnium oxide, tantalum oxide, tungsten oxide, yttrium oxide, alumina, and talc. In particular, for the purpose of improving the relative permittivity of the cured film, those having a relative permittivity ($\varepsilon r$) of 20 or more, such as titanium oxide ($\varepsilon r=115$), zirconium oxide ($\varepsilon r=30$), barium titanate ($\varepsilon r=400$), and hafnium oxide ($\varepsilon r=25$) can be mentioned as particularly preferred examples, but the inorganic particles are not limited thereto. The primary particle size of the inorganic particles is preferably 100 nm or less, more preferably 60 nm or less.

The content of the inorganic particles is preferably 5 parts by mass or more and 500 parts by mass or less based on 100 parts by mass of the amide group- and/or imide group-containing alkali-soluble resin (A). Setting the content in the above-mentioned range makes it possible to develop the above-mentioned effects of adding the inorganic particles, such as improvement in the relative permittivity with the alkali developing performance being maintained.

The photosensitive resin composition for thin film transistors of the present invention may contain a thermal acid generator. The thermal acid generator generates an acid by heating, and accelerates the crosslinking reaction of the thermal crosslinking agent. Moreover, when the amide group- and/or imide group-containing alkali-soluble resin (A) has an imide ring structure or an oxazole ring structure that are not closed, the thermal acid generator can promote the cyclization of these structures and further improve the mechanical properties of the cured film.

The thermal acid generator used in the present invention preferably has a thermal decomposition starting temperature of 50° C. to 270° C., more preferably 250° C. or lower. It is preferred to select a thermal acid generator that does not generate an acid in the drying (pre-baking: about 70 to 140° C.) after the photosensitive resin composition for thin film transistors of the present invention is applied to the substrate, and generates an acid in the final heating (curing: about 100 to 400° C.) after the patterning including exposure and development, because the reduction in sensitivity at the time of development can be suppressed.

The acid generated from the thermal acid generator used in the present invention is preferably a strong acid. Preferred examples of the strong acid include arylsulfonic acids such as p-toluenesulfonic acid and benzenesulfonic acid, alkylsulfonic acids such as methanesulfonic acid, ethanesulfonic acid, propanesulfonic acid, and butanesulfonic acid, and haloalkylsulfonic acids such as trifluoromethylsulfonic acid. They are used as a salt such as an onium salt or as a covalent compound such as an imidosulfonate. The photosensitive resin composition for thin film transistors may contain two or more of these.

The content of the thermal acid generator used in the present invention is preferably 0.01 parts by mass or more and 10 parts by mass or less based on 100 parts by mass of the amide group- and/or imide group-containing alkali-soluble resin (A). Setting the content in the above-mentioned range makes it possible to develop the above-mentioned effects of adding the thermal acid generator with the high heat resistance being maintained.

Next, a method for preparing the photosensitive resin composition for thin film transistors of the present invention will be described. For example, the photosensitive resin composition for thin film transistors can be obtained by dissolving the components (A) to (C) and, if necessary, a thermal crosslinking agent, an adhesion improver, a surfactant, a phenolic hydroxyl group-containing compound, inorganic particles, a thermal acid generator, and the like. As a dissolution method, stirring and heating can be mentioned. In the case of heating, the heating temperature is preferably set within a range in which the performance of the photosensitive resin composition for thin film transistors is not impaired, and the heating temperature is usually from room temperature to 80° C. In addition, the order of dissolving the components is not particularly limited, and for example, there is a method of sequentially dissolving the components starting from a compound having low solubility. Further, as for components which tend to generate air bubbles at the time of dissolution by stirring, such as a surfactant and some kind of adhesion improver, poor dissolution of other components caused by generation of air bubbles can be prevented by first dissolving such other components and lastly adding the relevant components.

It is preferred that the resultant photosensitive resin composition for thin film transistors is filtered using a filtration filter to remove dust and particles. The filter pore size is, for example, 0.5 μm, 0.2 μm, 0.1 μm, 0.07 μm, 0.05 μm, or 0.02 μm, but it is not limited thereto. Materials of the filtration filter include polypropylene (PP), polyethylene (PE), nylon (NY), polytetrafluoroethylene (PTFE) and the like, with polyethylene and nylon being preferred.

The cured film of the present invention is obtained by curing the photosensitive resin composition for thin film transistors of the present invention. Hereinafter, the method for producing the cured film of the present invention will be described in detail.

The method for producing a cured film of the present invention includes the steps of applying the photosensitive resin composition for thin film transistors of the present invention to form a photosensitive resin film, drying the photosensitive resin film, exposing the photosensitive resin film, developing the exposed photosensitive resin film, and thermally curing the photosensitive resin film. Details of the steps will be described below. In the present invention, as for the film formed on a substrate, the film after the application of the photosensitive resin composition for thin film transistors to the substrate and before the thermal curing is referred to as a photosensitive resin film, and the film after the thermal curing is referred to as a cured film. The photosensitive resin film after the application of the photosensitive resin composition for thin film transistors and before the drying is sometimes referred to as a coating film.

First, the step of applying a photosensitive resin composition for thin film transistors to a substrate to form a photosensitive resin film will be described. In this step, the photosensitive resin composition for thin film transistors of the present invention is applied by a spin coating method, a slit coating method, a dip coating method, a spray coating method, a printing method or the like to give a coating film of the photosensitive resin composition for thin film transistors. Among them, the slit coating method is preferably used. The slit coating method is advantageous in terms of cost reduction because the resin composition can be applied with a small amount of coating liquid. The amount of coating liquid required for the slit coating method is, for example, about ⅕ to 1/10 that of the spin coating method. The slit nozzle used for the application is not particularly limited, and those which are on the market from several manufacturers can be used. Specific examples of the slit nozzle include "Linear Coater" manufactured by Dainippon Screen Mfg. Co., Ltd., "Spinless" manufactured by TOKYO OHKA KOGYO CO., LTD., "TS Coater" manufactured by Toray Engineering Co., Ltd., "Table Coater" manufactured by CHUGAI RO CO., LTD., "CS series" and "CL series" manufactured by Tokyo Electron Limited, "In-line type slit coater" manufactured by Thermatronics Trading, and "Head Coater HC series" manufactured by Hirata Corporation. The coating speed is generally in the range of 10 mm/sec to 400 mm/sec. The thickness of the coating film varies depending on the solid content concentration, viscosity, and the like of the photosensitive resin composition for thin film transistors, and the photosensitive resin composition is usually applied so that the film thickness after drying is 0.1 to 10 μm, preferably 0.3 to 5 μm.

Prior to the application, the base material to which the photosensitive resin composition for thin film transistors is applied may be pretreated with the above-mentioned adhesion improver in advance. For example, there is a method in which a solution prepared by dissolving 0.5 to 20% by mass of an adhesion improver in a solvent such as isopropanol, ethanol, methanol, water, tetrahydrofuran, propylene glycol monomethyl ether acetate, propylene glycol monomethyl ether, ethyl lactate, or diethyl adipate is used to treat a base material surface. Examples of methods for treating the base material surface include spin coating, slit die coating, bar coating, dip coating, spray coating, and steam treatment.

Next, the step of drying the coating film, that is, the photosensitive resin film will be described. In this step, the coating film, which is obtained after application of the photosensitive resin composition for thin film transistors, is dried. Drying in this step refers to reduced-pressure drying or heat drying. Both the reduced-pressure drying and heat drying may be carried out, or only one of them may be used.

First, the reduced-pressure drying will be described. In the reduced-pressure drying, for example, a substrate having a coating film formed thereon is placed on a proxy pin disposed in a vacuum chamber, and the pressure in the vacuum chamber is reduced to dry the coating film. In this case, when the interval between the substrate and the vacuum chamber top plate is large, the air located between the substrate and the vacuum chamber top plate flows in a large quantity in connection with the reduced-pressure drying, so that fog or haze is likely to occur. Therefore, it is preferred to adjust the height of the proxy pin so as to narrow the interval. The distance between the substrate and the vacuum chamber top plate is preferably about 2 to 20 mm, more preferably 2 to 10 mm.

The reduced-pressure drying speed depends on the vacuum chamber capacity, capability of the vacuum pump, and diameter of the pipe between the chamber and the pump. For example, the vacuum chamber is used in a condition that the interior of the vacuum chamber is depressurized to 40 Pa after elapse of 60 seconds in the absence of the coated substrate. In general, the reduced-pressure drying time is about 30 to 100 seconds, and the ultimate pressure of the inferior of the vacuum chamber at the time of completion of reduced-pressure drying is usually 100 Pa or less in the presence of the coated substrate. Setting the ultimate pressure to 100 Pa or less brings the surface of the coating film into a dry state without stickiness, whereby occurrence of surface contamination and generation of particles can be suppressed in the subsequent substrate conveyance.

Next, heat drying will be described. This step is also called pre-baking. For drying, a hot plate, an oven, infrared rays or the like is used. In the case where a hot plate is used, the coating film is directly held on a plate, or held on a jig such as a proxy pin placed on a plate and heated. The material of the proxy pin may be a metal material such as aluminum and stainless steel, or a synthetic resin such as polyimide resin or "Teflon (registered trademark)", and the proxy pin may be made from any material as long as it has heat resistance. The height of the proxy pin varies depending on the size of the substrate, the kind of the coating film, the purpose of heating and the like, and is preferably about 0.1 to 10 mm. The heating temperature varies depending on the kind and purpose of the coating film, and heating is preferably carried out at a temperature in the range of 50° C. to 180° C. for 1 minute to several hours.

Next, the step of exposing the photosensitive resin film will be described. In this step, in order to form a pattern from the obtained photosensitive resin film, the photosensitive resin film is irradiated with actinic rays through a mask having a desired pattern, that is, the photosensitive resin film is exposed. Examples of the actinic rays used for exposure include ultraviolet rays, visible rays, electron beam, and X-ray. In the present invention, it is preferred to use i-line (365 nm), h-line (405 nm), and g-line (436 nm) of a mercury lamp. In the case where the photosensitive resin film has positive photosensitivity, the exposed part is soluble in the developer. In the case where the photosensitive resin film has negative photosensitivity, the exposed part is cured and insolublized in the developer.

Next, the step of developing the exposed photosensitive resin film will be described. In this step, after exposure, a desired pattern is formed by using a developer to remove the exposed part in the case where the photosensitive resin film has positive photosensitivity and remove the unexposed part in the case where the photosensitive resin film has negative photosensitivity. As for the developer, in either case of positive photosensitivity and negative photosensitivity, it is preferred to use an aqueous solution of a compound having alkalinity, such as tetramethylammonium hydroxide, diethanolamine, diethylaminoethanol, sodium hydroxide, potassium hydroxide, sodium carbonate, potassium carbonate, triethyl amine, diethylamine, methylamine, dimethylamine, dimethylaminoethyl acetate, dimethylaminoethanol, dimethylaminoethyl methacrylate, cyclohexylamine, ethylenediamine, and hexamethylenediamine. In some cases, polar solvents such as N-methyl-2-pyrrolidone, N,N-dimethylformamide, N,N-dimethylacetamide, dimethylsulfoxide, γ-butyrolactone, and dimethylacrylamide, alcohols such as methanol, ethanol, and isopropanol, esters such as ethyl lactate and propylene glycol monomethyl ether acetate, and ketones such as cyclopentanone, cyclohexanone, isobutyl ketone, and methyl isobutyl ketone, alone or in combination of several kinds, may be added to the alkaline aqueous solution. The developing system may be, for example, a spray, paddle, immersion, or ultrasonic wave system.

Then, it is preferred to rinse the pattern formed by development with distilled water. Also in the rinsing treatment, alcohols such as ethanol and isopropyl alcohol, and esters such as ethyl lactate and propylene glycol monomethyl ether acetate may be added to distilled water.

Next, the thermal curing step will be described. In this step, components low in heat resistance can be removed by thermal curing, so that heat resistance and chemical resistance can be improved. In particular, when the photosensitive resin composition for thin film transistors of the present invention contains an alkali-soluble resin selected from polyimide precursors and polybenzoxazole precursors, a copolymer thereof, or a copolymer thereof with a polyimide, an imide ring or an oxazole ring can be formed by thermal curing, so that heat resistance and chemical resistance can be improved. When the photosensitive resin composition for thin film transistors of the present invention contains a compound having at least two alkoxymethyl groups, methylol groups, epoxy groups, or oxetanyl groups, the thermal crosslinking reaction can proceed by thermal curing, and heat resistance and chemical resistance can be improved. The thermal curing is carried out for 5 minutes to 5 hours by selecting a temperature and raising the temperature in stages or selecting a certain temperature range and continuously raising the temperature. For example, heat treatment is performed at 150° C., 250° C., and 400° C. each for 30 minutes, or the temperature is linearly raised from room temperature to 400° C. over 2 hours. The thermal curing condition in the present invention is preferably 300° C. or higher, more preferably 350° C. or higher, further preferably 360° C. or higher from the viewpoint of reducing the amount of outgassing from the cured film. The temperature is preferably 500° C. or lower, more preferably 450° C. or lower from the viewpoint of imparting sufficient film toughness to the cured film.

In the method for manufacturing a thin film transistor of the present invention, the cured film obtained by the above-mentioned method is used in at least one of a gate insulating layer and an interlayer insulating layer of a thin film transistor.

In the case where the cured film of the present invention is used in a thin film transistor, the amount of outgassing from the insulating layer is preferably small because only a trace amount of outgassing components cause deterioration in driving performance of the thin film transistor. In this regard, of the outgassing components released when the cured film of the present invention is heated at 180° C. for 30 minutes, the amount of the organic solvent component generated is preferably 1 ppm or less, more preferably 0.5 ppm or less, further preferably 0.2 ppm or less. The total generation amount of the outgassing components is preferably 5 ppm or less, more preferably 4 ppm or less, further preferably 3 ppm or less. Kinds and amounts of the generated gas components can be measured by, for example, purge-and-trap/GC-MS method in which the gas is adsorbed and trapped by a purge-and-trap method and the gas is detected by gas chromatograph mass spectrometry (GC-MS). As a more specific measurement method, kinds and amounts of the generated gas components can be measured by, for example, decomposing and polishing a thin film transistor to expose the insulating layer, collecting a required amount of the insulating layer, heating the insulating layer at 180° C. for 30 minutes, analyzing the components adsorbed and trapped by a purge-and-trap method using GC-MS, and forming a calibration curve using n-hexadecane as a standard substance.

The thin film transistor of the present invention has the cured film of the present invention in at least one of the gate insulating layer and the interlayer insulating layer. Hereinafter, a thin film transistor of the present invention will be described with reference to the drawings.

FIG. 1 is a cross-sectional view showing an example of a thin film transistor of the present invention, and the thin film transistor has a top gate type structure. The thin film transistor of the present invention illustrated in FIG. 1 has a substrate 1, a buffer layer 2 on the substrate 1, a semiconductor layer 5 having a source region 3 and a drain region 4, and a gate insulating layer 6 that are formed on the buffer layer 2, a gate electrode 7 and an interlayer insulating layer 8 that are formed on the gate insulating layer 6, and a source electrode 9 and a drain electrode 10 that are formed to be electrically connected to the semiconductor layer 5.

FIG. 2 is a cross-sectional view showing another example of the thin film transistor of the present invention, and the thin film transistor has a bottom gate type structure. The thin film transistor of the present invention illustrated in FIG. 2 has a substrate 1, a buffer layer 2 on the substrate 1, a gate electrode 7 and a gate insulating layer 6 that are formed on the buffer layer 2, a semiconductor layer 5 having a source region 3 and a drain region 4, and an interlayer insulating layer 8 that are formed on the gate insulating layer 6, and a source electrode 9 and a drain electrode 10 that are formed to be electrically connected to the semiconductor layer 5.

In these examples, at least one of the gate insulating layer 6 and the interlayer insulating layer 8 in FIG. 1, and at least one of the gate insulating layer 6 and the interlayer insulating layer 8 in FIG. 2 are the cured films of the present invention.

In the thin film transistor of the present invention, outgassing from the insulating layer can be sufficiently reduced even in a high temperature or high vacuum environment in other manufacturing steps of the thin film transistor and the subsequent manufacturing steps of the display device, by using the cured film of the present invention in at least one of the gate insulating layer and the interlayer insulating layer. Suppression of outgassing prevents contamination of the semiconductor layer with impurities, and can provide excellent TFT driving characteristics.

In the thin film transistor of the present invention, at least one of the gate insulating layer and the interlayer insulating layer is formed using the photosensitive resin composition for thin film transistors of the present invention, whereby expensive vacuum deposition equipment required for forming a conventional inorganic insulating layer is not required and cost can be reduced. The insulating layer can be patterned by applying, exposing, and developing the photosensitive resin composition for thin film transistors, and can be processed easily without requiring a resist material. Furthermore, since the film toughness is higher than in an inorganic film, occurrence of cracks can be suppressed even when a flexible substrate is used.

For use in applications where the requirement for TFT driving characteristics is particularly severe, such as a flexible display device including a plastic substrate, the thin film transistor of the present invention is preferably a top gate type transistor having the cured film of the present invention as an interlayer insulating layer, and containing at least one of silicon nitride, silicon oxide, and silicon oxynitride in a gate insulating layer. In the top gate type thin film transistor, as illustrated in FIG. 1, the interlayer insulating layer is not in contact with the semiconductor layer, and the gate insulating layer is in contact with the semiconductor layer. Therefore, use of an inorganic film in the gate insulating layer makes it easy to obtain high TFT driving characteristics. Meanwhile, it is common to form a thicker interlayer insulating layer than the gate insulating layer in order to secure the insulating property. Use of a cured film containing the photosensitive resin composition for thin film transistors in a thicker interlayer insulating layer gives high crack resistance.

Hereinafter, constituent elements of the thin film transistor of the present invention will be described in detail.

The substrate used in the thin film transistor of the present invention is not particularly limited as long as a thin film transistor can be formed on the substrate. As the substrate, for example, glass, quartz, silicon, ceramics, and plastics can be mentioned. Examples of plastics include polyimide, polyethylene terephthalate, polybutylene terephthalate, polyethersulfone, and polyethylene naphthalate.

The buffer layer used in the thin film transistor of the present invention plays a role of flattening the surface while preventing penetration of impurities from the substrate, and is not particularly limited as long as it exhibits this effect. Examples of the buffer layer include silicon nitride ($SiN_x$), silicon oxide ($SiO_x$), and silicon oxynitride ($SiO_xN_y$). However, the buffer layer is not always necessary and can be omitted.

The semiconductor layer used in the thin film transistor of the present invention is not particularly limited as long as a thin film transistor can be formed on the substrate, and examples thereof include polysilicon, amorphous silicon, an oxide semiconductor, and an organic semiconductor. Examples of the oxide semiconductor include zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), InGaZnO, InAlZnO, InSiZnO, InNiZnO, InCuZnO, InHfZnO, and InZnO semiconductors. Examples of the organic semiconductor include polythiophene, polyacetylene, polyfluorene, polyphenylenevinylene, polypyrrole, polyaniline, tetracene, pentacene, oligothiophene, perylene, heteroacene, phthalocyanine, and phenylene semiconductors.

In the thin film transistor of the present invention, at least one of the gate insulating layer and the interlayer insulating layer is formed using the photosensitive resin composition for thin film transistors of the present invention. Therefore, when the photosensitive resin composition for thin film transistors of the present invention is used in the interlayer insulating layer, a different material may be used in the gate insulating layer. Alternatively, when the photosensitive resin composition for thin film transistors of the present invention is used in the gate insulating layer, a different material may be used in the interlayer insulating layer. The different material used in the gate insulating layer or the interlayer insulating layer is not particularly limited as long as it can impart required insulating properties, and examples thereof include silicon nitride ($SiN_x$), silicon oxide ($SiO_x$), and silicon oxynitride ($SiO_xN_y$).

The gate electrode, the source electrode, and the drain electrode used in the thin film transistor of the present invention are not particularly limited as long as they can impart required conductivity, and examples thereof include metals such as Cr, Mo, Al, Cu, Ag, Au, Ti, Ta, Nb, W, Fe, Ni, Co, Rh, Nd, and Pb, and alloys and silicides containing these metals. A conductive material such as ITO or IZO can also be used.

The method for manufacturing a thin film transistor of the present invention includes the method for producing the cured film of the present invention. A method for manufacturing a thin film, transistor using the cured film in at least one of a gate insulating layer and an interlayer insulating layer is not particularly limited, and a general method can be used.

In the thin film transistor of the present invention, the type of the substrate is not particularly limited, but the thin film transistor is preferably provided on a flexible substrate with which the insulating layer is required to have crack resistance.

The thin film transistor of the present invention can be suitably used in a liquid crystal display device or an organic electroluminescent display device (organic EL display device). In particular, the thin film transistor of the present invention can be suitably used in a flexible display device manufactured using a flexible substrate. Apart from display devices, the thin film transistor of the present invention can also be applied to an IC card, an ID tag, and the like manufactured using a flexible substrate.

The liquid crystal display device or the organic electroluminescent display device of the present invention includes the thin film transistor of the present invention.

In the method for manufacturing a liquid crystal display device or an organic electroluminescent display device according to the present invention, a thin film transistor obtained by the method for manufacturing a thin film transistor of the present invention is used. As a method for manufacturing a liquid crystal display device using a thin film transistor obtained by the method for manufacturing a thin film transistor of the present invention, a known method described in, for example, Japanese Patent Laid-open Publication No. 2014-157204 can be used. As a method for manufacturing an organic electroluminescent display device using a thin film transistor obtained by the method for manufacturing a thin film transistor of the present invention, a known method described in, for example, Japanese Patent Laid-open Publication No. 2008-40324 can be used.

EXAMPLES

Hereinafter, the present invention will be described with reference to examples and the like, but the present invention is not limited to these examples. The photosensitive resin compositions for thin film transistors, cured films, and thin film transistors in the examples were evaluated by the following methods.

(1) Analysis of Outgassing from Cured Film

A varnish according to each reference example was applied to an 8-inch silicon wafer by a spin coating method and pre-baked on a hot plate at 120° C. for 2 minutes. The varnish was developed with a 2.38% aqueous TMAH solution for 60 seconds and rinsed with pure water. Then, the developed varnish was cured in an oven at 380° C. for 60 minutes under a nitrogen atmosphere to give a cured film having a thickness of 1.0 μm.

Of the obtained cured film, a 10-mg portion was adsorbed and trapped by a purge-and-trap method. Specifically, the collected cured film was heated at 180° C. for 30 minutes using helium as a purge gas, and the desorbed components were collected on an adsorbent (Carbotrap 400).

The collected components were subjected to thermal desorption at 280° C. for 5 minutes, and then subjected to GC-MS analysis using a GC-MS apparatus 6890/5973N (manufactured by Agilent) and using a column DB-5 (manufactured by Agilent, inner diameter: 0.25 mm, length: 30 m, film thickness: 1.0 μm) under conditions of a column temperature of 40 to 300° C. (heating rate: 8° C./min), helium (1.5 mL/min) as a carrier gas, and a scan range of m/z=29 to 600. GC-MS analysis was performed using n-hexadecane as a standard substance under the same conditions as described above to form a calibration curve, and the gas generation amount in terms of n-hexadecane was calculated.

(2) Characteristics Evaluation of Thin Film Transistor

The thin film transistor used in examples of the present invention is shown in FIG. 3, and the method for manufacturing the thin film transistor will be described below in order. An aluminum film having a thickness of 100 nm was formed on a glass substrate 11 having a thickness of 0.7 mm by a magnetron DC sputtering method. Then, a positive resist solution was applied to the aluminum film and then dried on a hot plate at 90° C. to form a resist film. Then, the resist film was patterned by exposure and development, and then aluminum was selectively removed only in a region without the resist pattern using a phosphorus nitric acid etchant. Then, the resist film was removed using a stripper (monoethanol amine/dimethyl sulfoxide=7/3), washed with pure water, and dried on a hot plate at 100° C. for 30 minutes. In this way, a gate electrode 12 was formed. Then, the photosensitive resin composition for thin film transistors according to each reference example was applied by spin coating and dried on a hot plate at 100° C. to prepare a pre-baked film having a thickness of 1000 nm. The obtained pre-baked film was developed with a 2.38% aqueous TMAH solution and then rinsed with water. Then, the film was cured in an oven at 380° C. for 60 minutes under a nitrogen atmosphere. In this way, a cured film having a thickness of 500 nm was obtained and used as a gate insulating layer 13.

Then, an a-Si layer (amorphous silicon layer) having a thickness of 250 nm serving as a semiconductor layer 14 and an n+Si layer having a thickness of 50 nm. serving as an impurity-containing semiconductor layer 15 were formed in order by CVD (Chemical Vapor Deposition). Then, a positive resist solution was applied to the impurity-containing semiconductor layer and then dried on a hot plate at 90° C. to form a resist film. Then, the resist film was patterned by exposure and development, and then the impurity-containing semiconductor layer and the semiconductor layer were selectively removed only in a region without the resist pattern by dry etching. Then, the resist film was removed using a stripper (monoethanolamine/dimethyl sulfoxide=7/3), washed with pure water, and dried on a hot plate at 100° C. for 30 minutes. In this way, the patterned semiconductor layer 14 and impurity-containing semiconductor layer 15 were obtained.

Then, an aluminum film having a thickness of 100 nm was formed by a magnetron DC sputtering method. Then, a positive resist solution was applied to the aluminum film and then dried on a hot plate at 90° C. to form a resist film. Then, the resist film was patterned by exposure and development, and then aluminum was selectively removed only in a region without the resist pattern using a phosphorus nitric acid etchant. Then, the n+Si layer was selectively removed only in a region without the resist pattern by dry etching using sulfur hexafluoride gas. Then, the resist film was removed using a stripper (monoethanolamine/dimethyl sulfoxide=7/3), washed with pure water, and dried on a hot plate at 100° C. for 30 minutes. In this way, an aluminum source electrode 16 and an aluminum drain electrode 17 having an electrode width (channel width) of 0.2 mm, an electrode interval (channel length) of 20 μm, and a thickness of 100 nm were obtained.

Then, the photosensitive resin composition for thin film transistors according to each reference example was applied by spin coating and dried on a hot plate at 100° C. to prepare a pre-baked film having a thickness of 1800 nm. A photomask was placed on the obtained pre-baked film, and the pre-baked film was exposed, then developed with a 2.38% aqueous TMAH solution, and then rinsed with water. Then, the pre-baked film was cured in an oven at 380° C. for 60 minutes under a nitrogen atmosphere. In this way, an interlayer insulating layer 18 having a thickness of 1000 nm was obtained in such a manner that part of the source electrode 16 and the drain electrode 17 was exposed.

Thus, a thin film transistor substrate including a gate insulating layer and an interlayer insulating layer containing the photosensitive resin composition for thin film transistors was obtained.

As for the manufactured thin film transistor substrate, the drain current when the gate voltage was swept in the range of −20 V to 20 V was measured using a semiconductor characteristics evaluation system model 4200-SCS (manufactured by Keithley Instruments, Inc.), and the threshold voltage Vth was calculated. After the measurement, the substrate was placed on a hot plate heated to 80° C. for 100 hours, and then the threshold voltage Vth was calculated in the same manner as described above. A difference between threshold voltages before and after the high-temperature deterioration test was calculated, and an absolute value of the calculated value was regarded as ΔVth.

(3) Foreign Matter Evaluation of Photosensitive Resin Film

Using a coating and developing apparatus "CLEAN TRACK ACT-12" manufactured by Tokyo Electron Co., Ltd., the photosensitive resin composition for thin film transistors according to each reference example immediately after filtration was applied to a 12-inch Si wafer and dried on a hot plate at 100° C. for 3 minutes to give a photosensitive resin film having a thickness of 1000 nm. As for the obtained photosensitive resin film, the number of foreign matters having a size of 0.27 μm or more was measured with a wafer surface inspection apparatus "WM-10" manufactured by TOPCON CORPORATION. The measurement area was an area of about 201 cm² inside a circle having a radius of 8 cm from the center of the wafer, and the number of foreign matters per 1 cm² of the coating film was determined.

(4) Determination of Temporal Change of Foreign Matters

Using the photosensitive resin composition for thin film transistors filtered and then stored at −40° C. for 90 days, a photosensitive resin film was prepared by the method described in (3), and foreign matter evaluation was carried out.

Synthesis Example 1 Synthesis of Hydroxy Group-Containing Diamine Compound

In 100 mL of acetone and 17.4 g (0.3 mol) of propylene oxide, 18.3 g (0.05 mol) of 2,2-bis(3-amino-4-hydroxyphenyl)hexafluoropropane (hereinafter referred to as BAHF) was dissolved, and the solution was cooled to −15° C. A solution of 20.4 g (0.11 mol) of 3-nitrobenzoyl chloride in 100 mL of acetone was added dropwise thereto. After completion of the dropwise addition, the mixture was allowed to react at −15° C. for 4 hours and then returned to room temperature. The deposited white solid was separated by filtration and vacuum, dried at 50° C.

In a 300-mL stainless steel autoclave, 30 g of the solid was placed and dispersed in 250 mL of methyl cellosolve, and 2 g of 5% palladium-carbon was added thereto. Hydrogen was introduced into the mixture by a balloon and a reduction reaction was carried out at room temperature. After about 2 hours, it was confirmed that the balloon would not deflate anymore and the reaction was completed. After completion of the reaction, the palladium compound as a catalyst was removed by filtration, and the mixture was concentrated with a rotary evaporator to give a hydroxyl group-containing diamine compound represented by the following formula.

[Chemical Formula 6]

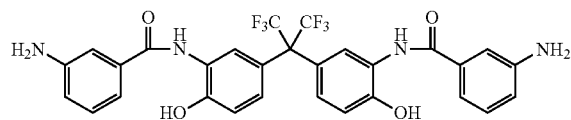

Synthesis Example 2 Synthesis of Alkali-Soluble Resin (A-1)

Under a dry nitrogen stream, 29.3 g (0.08 mol) of BAHF, 1.24 g (0.005 mol) of 1,3-bis(3-aminopropyl)tetramethyldisiloxane, and 3.27 g (0.03 mol) of 3-aminophenol as an end-capping agent were dissolved in 150 g of N-methyl-2-pyrrolidone (NMP). To the mixture, 31.0 g (0.1 mol) of 3,3',4,4'-diphenyl ether tetracarboxylic dianhydride (hereinafter referred to as ODPA) was added together with 50 g of NMP, and the mixture was stirred at 20° C. for 1 hour and then at 50° C. for 4 hours. Then, 15 g of xylene was added to the mixture, and the mixture was stirred at 150° C. for 5 hours while azeotropically distilling water together with xylene. After completion of the stirring, the solution was poured into 3 L of water and a white precipitate was collected. This precipitate was collected by filtration, washed three times with water, and then dried in a vacuum dryer at 80° C. for 24 hours to give an intended alkali-soluble resin (A-1) as a polyimide.

Synthesis Example 3 Synthesis of Alkali-Soluble Resin (A-2)

Under a dry nitrogen stream, 31.0 g (0.10 mol) of ODPA was dissolved in 500 g of NMP. To the mixture, 45.35 g (0.075 mol) of the hydroxyl group-containing diamine compound obtained in Synthesis Example 1 and 1.24 g (0.005 mol) of 1,3-bis(3-aminopropyl)tetramethyldisiloxane were added together with 50 g of NMP, and the mixture was reacted at 20° C. for 1 hour and then at 50° C. for 2 hours. Then, 4.36 g (0.04 mol) of 4-aminophenol as an end-capping agent was added together with 5 g of NMP, and the mixture was reacted at 50° C. for 2 hours. Then, a solution prepared by diluting 28.6 g (0.24 mol) of N,N-dimethylformamide dimethyl acetal with 50 g of NMP was added dropwise over 10 minutes. After the dropwise addition, the mixture was stirred at 50° C. for 3 hours. After completion of the stirring, the solution was cooled to room temperature, and then the solution was poured into 3 L of water to give a white precipitate. This precipitate was collected by filtration, washed three times with water, and then dried in a vacuum dryer at 80° C. for 24 hours to give an intended alkali-soluble resin (A-2) as a polyimide precursor.

Synthesis Example 4 Synthesis of Alkali-Soluble Resin (A-3)

Under a dry nitrogen stream, 18.3 g (0.05 mol) of BAHF was dissolved in 50 g of NMP and 26.4 g (0.3 mol) of glycidyl methyl ether, and the solution temperature was reduced to −15° C., To the mixture, a solution obtained by dissolving 7.4 g (0.025 mol) of diphenyl ether dicarboxylic acid dichloride (manufactured by NIHON NOHYAKU CO., LTD.) and 5.1 g (0.025 mol) of isophthalic acid chloride (manufactured by Tokyo Chemical Industry Co., Ltd.) in 25 g; of γ-butyrolactone (GBL) was added dropwise so that the internal temperature would not exceed 0° C. After completion of the dropwise addition, stirring was continued at −15° C. for 6 hours. After completion of the reaction, the solution was poured into 3 L of water containing 10% by mass of methanol and a white precipitate was collected. This precipitate was collected by filtration, washed three times with water, and then dried in a vacuum dryer at 80° C. for 24 hours to give an intended alkali-soluble resin (A-3) as a polybenzoxazole precursor.

Synthesis Example 5 Synthesis of Quinonediazide Compound (B-1)

Under a dry nitrogen stream, 21.22 g (0.05 mol) of TrisP-PA (trade name, manufactured by Honshu Chemical Industry Co., Ltd.) and 36.27 g (0.135 mol) of 5-naphthoquinonediazide sulfonyl acid chloride were dissolved in 450 g of 1,4-dioxane, and the temperature was adjusted to room temperature. To the mixture, 15.18 g of triethylamine mixed with 50 g of 1,4-dioxane was added dropwise so that the inside of the system would not reach 35° C. or higher. After the dropwise addition, the mixture was stirred at 30° C. for 2 hours. The triethylamine salt was filtered and the filtrate was poured into water. After that, the deposited precipitate was collected by filtration. This precipitate was dried in a vacuum dryer to give a quinonediazide compound (B-1) represented by the following formula.

[Chemical Formula 7]

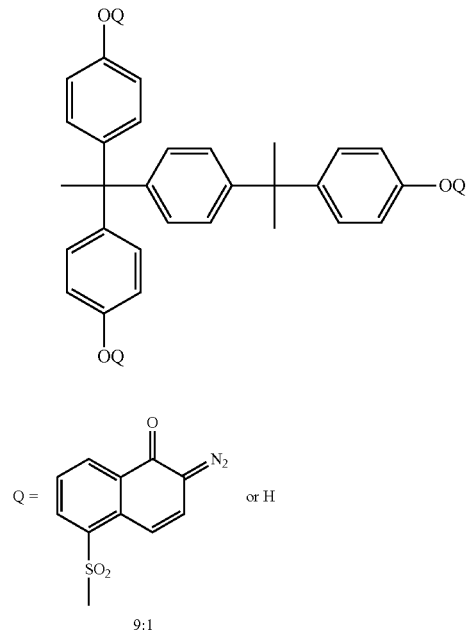

Synthesis Example 6 Synthesis of Quinonediazide Compound (B-2)

Undera dry nitrogen stream, 21.22 g (0.05 mol) of TrisP-PA (trade name, manufactured by Honshu Chemical Industry Co., Ltd.) and 36.27 g (0.135 mol) of 4-naphthoquinonediazide sulfonyl acid chloride were dissolved in 450 g of 1,4-dioxane, and the temperature was adjusted to room temperature. To the mixture, 15.18 g of triethylamine mixed with 50 g of 1,4-dioxane was added dropwise so that the inside of the system would not reach 35° C. or higher. After the dropwise addition, the mixture was stirred at 30° C. for 2 hours. The triethylamine salt was filtered and the filtrate was poured into water. After that, the deposited precipitate was collected by filtration. This precipitate was dried in a vacuum dryer to give a quinonediazide compound (B-2) represented by the following formula.

[Chemical Formula 8]

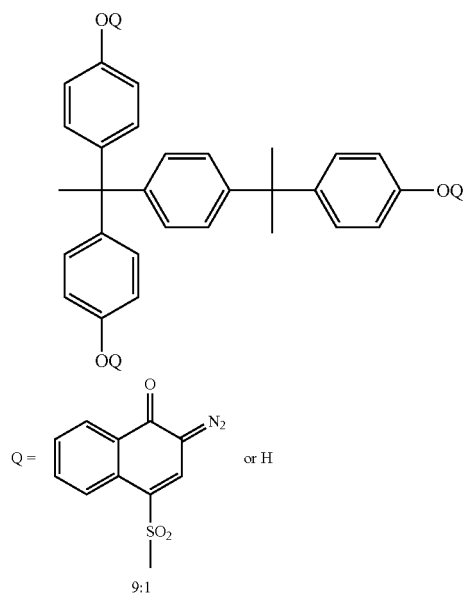

9:1

Production Example 1

In 40.0 g of propylene glycol monomethyl ether (hereinafter referred to as PGME) as an organic solvent, 10.0 g of the alkali-soluble resin (A-1) obtained in Synthesis Example 2 and 1.0 g of (B-1) were dissolved, and the solution was filtered with a 0.2 μm polytetrafluoroethylene filter (manufactured by Sumitomo Electric Industries, Ltd.) to give a photosensitive resin composition (varnish) A for thin film transistors.

Production Examples 2 to 19

Varnishes B to S were obtained in the same manner as in Production Example 1 using the compounds whose kinds and amounts are as shown in Table 1. As for the organic solvents used in the production examples, the presence or absence of nitrogen atoms and oxygen atoms in the molecular structure, the solubility parameter, and the boiling point at atmospheric pressure are shown in Table 2.

Examples 1 to 15, and Comparative Examples 1 to 4

Using the varnishes of Production Examples 1 to 19, production of a cured film and outgassing analysis were carried out according to the method described in (1) Analysis of outgassing from cured film described above. Moreover, a thin film transistor was manufactured and evaluated for the characteristics according to the method described in (2) Characteristics evaluation of thin film transistor described above. The results are shown in Table 3.

In the cured films of Examples 1 to 15, the total generation amount of outgassing components was 7 ppm or less and the generation amount of organic solvent component was 3 ppm or less, whereas in the cured films of Comparative Examples 1 to 4, the total generation amount of outgassing components and the generation amount of organic solvent component were large. In particular, in the cured films of Examples 1 to 4 and 6 to 15, both the total generation amount of outgassing components and the generation amount of organic solvent component were small, that is, 5 ppm or less and 1 ppm or less, respectively. Further, in the thin film transistors of Examples 1 to 15, ΔVth which is the absolute value of the difference between threshold voltages before and after the high-temperature deterioration test was small, and the thin film transistors showed good driving performance. On the other hand, in the thin film transistors of Comparative Examples 1 to 4, it was found that the ΔVth was large and the deterioration of the driving performance at the time of high temperature driving was large. It is considered that this driving performance deterioration is caused by outgassing from the cured film. In particular, Example 14 in which a 4-naphthoquinone diazide sulfonyl ester compound was used as a photosensitizer and Example 15 in which an adhesion Improver was used resulted in a particularly small ΔVth.

In Examples 9 to 13 in which the content of the nitrogen atom-containing solvent in the varnish was 0.01% by mass or more and 1.0% by mass or less based on the organic solvent in total, even after the varnish was stored at a low temperature of −40° C. for a long period of time, increase in foreign matters was hardly observed, and good results were obtained.

TABLE 1

| | Photosensitive resin composition | (A) Alkali-soluble resin | (B) Photosensitive compound | (C) Organic solvent | (D) Adhesion improver | Content of nitrogen atom-containing organic solvent in organic solvent (% by mass) |
|---|---|---|---|---|---|---|
| Production Example 1 | A | A-1 10.0 g | B-1 1.0 g | PGME 60.0 g | | 0 |
| Production Example 2 | B | A-1 10.0 g | B-1 1.0 g | PGME 60.0 g | | 0 |
| Production Example 3 | C | A-1 10.0 g | B-1 1.0 g | EDE 60.0 g | | 0 |
| Production Example 4 | D | A-1 10.0 g | B-1 1.0 g | PGME/PG 48.0 g/12.0 g | | 0 |
| Production Example 5 | E | A-1 10.0 g | B-1 1.0 g | PGME/PG 36.0 g/24.0 g | | 0 |
| Production Example 6 | F | A-2 10.0 g | B-1 1.0 g | PGME 60.0 g | | 0 |
| Production Example 7 | G | A-3 10.0 g | B-1 1.0 g | PGME 60.0 g | | 0 |
| Production Example 8 | H | A-1 10.0 g | B-1 2.5 g | PGME 60.0 g | | 0 |

TABLE 1-continued

| | Photosensitive resin composition | (A) Alkali-soluble resin | (B) Photosensitive compound | (C) Organic solvent | (D) Adhesion improver | Content of nitrogen atom-containing organic solvent in organic solvent (% by mass) |
|---|---|---|---|---|---|---|
| Production Example 9 | I | A-1 10.0 g | B-1 1.0 g | PGME/DMI 59.7 g/0.6 g | | 1 |
| Production Example 10 | J | A-1 10.0 g | B-1 1.0 g | PGME/DMI 59.7 g/0.3 g | | 0.5 |
| Production Example 11 | K | A-1 10.0 g | B-1 1.0 g | PGME/DMI 60.0 g/0.006 g | | 0.01 |
| Production Example 12 | L | A-1 10.0 g | B-1 1.0 g | PGME/DMI 60.0 g/0.06 g | | 0.1 |
| Production Example 13 | M | A-1 10.0 g | B-1 1.0 g | PGME/NMP 59.4 g/0.6 g | | 1 |
| Production Example 14 | N | A-1 10.0 g | B-1 1.0 g | PGME 60.0 g | | 0 |
| Production Example 15 | O | A-1 10.0 g | B-1 1.0 g | PGME 60.0 g | N-phenyl-3-aminopropyltrimethoxysilane 0.5 g | 0 |
| Production Example 16 | P | A-1 10.0 g | B-1 1.0 g | NMP 60.0 g | | 100 |
| Production Example 17 | Q | A-1 10.0 g | B-1 1.0 g | DMAc 60.0 g | | 100 |
| Production Example 18 | R | A-1 10.0 g | B-1 1.0 g | DMI 60.0 g | | 100 |
| Production Example 19 | S | A-1 10.0 g | B-1 1.0 g | PGME/NMP 57.0 g/3.0 g | | 5 |

TABLE 2

| Name | Abbreviation | Presence or absence of nitrogen atoms | Presence or absence of oxygen atoms | Solubility parameter [(cal/cm$^3$)$^{1/2}$] | Boiling point at atmospheric pressure [° C.] |
|---|---|---|---|---|---|
| Propylene glycol monomethyl ether | PGME | Absent | Present | 10.1 | 120 |
| Propylene glycol monomethyl ether acetate | PGMEA | Absent | Present | 8.7 | 146 |
| Diethylene glycol diethyl ether | EDE | Absent | Present | 8.6 | 189 |
| Propylene glycol | PG | Absent | Present | 12.6 | 187 |
| N-methyl-2-pyrrolidone | NMP | Present (amide group) | Present | 11.3 | 202 |
| N,N-dimethylacetamide | DMAc | Present (amide group) | Present | 10.8 | 177 |
| 1,3-Dimethyl-2-imidazolidinone | DMI | Present (urea group) | Present | 10.8 | 220 |

TABLE 3

| | Photosensitive resin composition | Analysis of outgassing from cured film | | Characteristics evaluation of thin film transistor ΔVth [V] | Foreign matter evaluation | |
|---|---|---|---|---|---|---|
| | | Generation amount of organic solvent component [ppm] | Total generation amount of outgassing components [ppm] | | Immediately after filtration [pieces/cm$^2$] | After −40° C./ 90 days [pieces/cm$^2$] |
| Example 1 | A | PGME: <0.1 | 2.1 | 0.2 | 0.03 | 0.24 |
| Example 2 | B | PGMEA: <0.1 | 2.3 | 0.2 | 0.04 | 0.33 |
| Example 3 | C | EDE: 0.7 | 3.7 | 0.4 | 0.02 | 0.26 |
| Example 4 | D | PGME: <0.1 PG: 0.8 | 3.5 | 0.4 | 0.02 | 0.25 |
| Example 5 | E | PGME: <0.1 PG: 2.4 | 6.1 | 1.0 | 0.02 | 0.22 |
| Example 6 | F | PGME: <0.1 | 2.5 | 0.2 | 0.02 | 0.19 |
| Example 7 | G | PGME: <0.1 | 2.6 | 0.2 | 0.02 | 0.31 |
| Example 8 | H | PGME: <0.1 | 4.1 | 0.4 | 0.02 | 0.20 |
| Example 9 | I | PGME: <0.1 DMI: 0.9 | 3.7 | 0.6 | 0.01 | 0.02 |

TABLE 3-continued

| | Photosensitive resin composition | Generation amount of organic solvent component [ppm] | Analysis of outgassing from cured film Total generation amount of outgassing components [ppm] | Characteristics evaluation of thin film transistor ΔVth [V] | Foreign matter evaluation Immediately after filtration [pieces/cm$^2$] | After −40° C./ 90 days [pieces/cm$^2$] |
|---|---|---|---|---|---|---|
| Example 10 | J | PGME: <0.1 DMI: 0.5 | 3.0 | 0.4 | 0.01 | 0.03 |
| Example 11 | K | PGME: <0.1 DMI: <0.1 | 2.1 | 0.2 | 0.01 | 0.06 |
| Example 12 | L | PGME: <0.1 DMI: 0.1 | 2.2 | 0.2 | 0.01 | 0.02 |
| Example 13 | M | PGME: <0.1 NMP: 0.9 | 3.4 | 0.5 | 0.01 | 0.02 |
| Example 14 | N | PGME: <0.1 | 1.6 | 0.1 | 0.04 | 0.25 |
| Example 15 | O | PGME: <0.1 | 2.3 | 0.1 | 0.03 | 0.23 |
| Comparative Example 1 | P | NMP: 11.2 | 24.9 | 1.9 | 0.01 | 0.01 |
| Comparative Example 2 | Q | DMAc: 9.0 | 11.2 | 1.5 | 0.01 | 0.01 |
| Comparative Example 3 | R | DMI: 13.9 | 16.0 | 1.7 | 0.01 | 0.01 |
| Comparative Example 4 | S | PGME: <0.1 NMP: 6.2 | 8.9 | 1.3 | 0.01 | 0.01 |

DESCRIPTION OF REFERENCE SIGNS

1: Substrate
2: Buffer layer
3: Source region
4: Drain region
5: Semiconductor layer
6: Gate insulating layer
7: Gate electrode
8: Interlayer insulating layer
9: Source electrode
10: Drain electrode
11: Substrate
12: Gate electrode
13: Gate insulating layer
14: Semiconductor layer
15: Impurity-containing semiconductor layer
16: Source electrode
17: Drain electrode
18: Interlayer insulating layer

The invention claimed is:

1. A photosensitive resin composition for thin film transistors, comprising:
(A) an amide group- and/or imide group-containing alkali-soluble resin,
(B) a photosensitive compound, and
(C) an organic solvent, wherein the organic solvent (C) contains 1% by mass or less of a nitrogen atom-containing organic solvent based on the organic solvent in total.

2. The photosensitive resin composition for thin film transistors according to claim 1, comprising 0.1 parts by mass or more and 20 parts by mass or less of the photosensitive compound (B) based on 100 parts by mass of the amide group- and/or imide group-containing alkali-soluble resin (A) selected from a polyimide, a polyimide precursor, and a polybenzoxazole precursor.

3. The photosensitive resin composition for thin film transistors according to claim 1, wherein the amide group- and/or imide group-containing alkali-soluble resin (A) is at least one alkali-soluble resin selected from a polyimide, a polyimide precursor, and a polybenzoxazole precursor, or a copolymer thereof.

4. The photosensitive resin composition for thin film transistors according to claim 1, wherein the organic solvent (C) contains 0.01% by mass or more and 0.5% by mass or less of the nitrogen atom-containing organic solvent based on the organic solvent in total.

5. The photosensitive resin composition for thin film transistors according to claim 1, wherein the organic solvent (C) contains 0.01% by mass or more and 1% by mass or less of the nitrogen atom-containing organic solvent based on the organic solvent in total.

6. The photosensitive resin composition for thin film transistors according to claim 1, wherein the organic solvent (C) contains 80% by mass or more of an organic solvent satisfying the following items (1) and (2) based on the organic solvent in total:
(1) a solubility parameter of 8.0 or more and 11.0 or less [unit: (cal/cm$^3$)$^{1/2}$]; and
(2) an organic compound composed of carbon, hydrogen and oxygen atoms.

7. The photosensitive resin composition for thin film transistors according to claim 6, wherein the organic solvent (C) satisfying items (1) and (2) further satisfies the following item (3):
(3) a boiling point at atmospheric pressure of 100° C. or higher and 180° C. or lower.

8. The photosensitive resin composition for thin film transistors according to claim 1, wherein the photosensitive compound (B) is a quinonediazide compound.

9. The photosensitive resin composition for thin film transistors according to claim 8, wherein the quinonediazide compound contains a 4-naphthoquinone diazide sulfonyl ester compound.

10. The photosensitive resin composition for thin film transistors according to claim 1, further comprising (D) an adhesion improver.

11. The photosensitive resin composition for thin film transistors according to claim 10, wherein the adhesion improver (D) contains a nitrogen atom-containing silane coupling agent.

12. A cured film which is a cured product of the photosensitive resin composition for thin film transistors according to claim 1.

13. A thin film transistor of a top gate type, comprising the cured film according to claim 12 in an interlayer insulating layer, and comprising at least one of silicon nitride, silicon oxide, and silicon oxynitride in a gate insulating layer.

14. A thin film transistor comprising the cured film according to claim 12 in at least one of a gate insulating layer and an interlayer insulating layer.

15. A liquid crystal display device or an organic electroluminescent display device comprising the thin film transistor according to claim 14.

* * * * *